United States Patent
Abe et al.

(10) Patent No.: US 12,458,217 B2
(45) Date of Patent: Nov. 4, 2025

(54) LIGHT EMITTING DEVICE AND MEDICAL DEVICE USING SAME

(71) Applicant: Panasonic Intellectual Property Management Co., Ltd., Osaka (JP)

(72) Inventors: Takeshi Abe, Osaka (JP); Shozo Oshio, Osaka (JP); Mitsuru Nitta, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 730 days.

(21) Appl. No.: 17/427,202

(22) PCT Filed: Jan. 27, 2020

(86) PCT No.: PCT/JP2020/002680
§ 371 (c)(1),
(2) Date: Feb. 8, 2022

(87) PCT Pub. No.: WO2020/162243
PCT Pub. Date: Aug. 13, 2020

(65) Prior Publication Data
US 2023/0105882 A1    Apr. 6, 2023

(30) Foreign Application Priority Data
Feb. 4, 2019  (JP) .................................. 2019-017797

(51) Int. Cl.
*A61B 1/06* (2006.01)
*F21V 9/38* (2018.01)
(Continued)

(52) U.S. Cl.
CPC .......... *A61B 1/0653* (2013.01); *A61B 1/0638* (2013.01); *A61B 1/0669* (2013.01);
(Continued)

(58) Field of Classification Search
CPC ... A61B 1/0653; A61B 1/0638; A61B 1/0669; A61B 1/00126; A61B 1/043; A61B 1/07;
(Continued)

(56) References Cited

U.S. PATENT DOCUMENTS 6,385,221 B1    5/2002 Neuberger
6,607,384 B1 *  8/2003 Nakanishi ............. A61C 1/088
                                                    433/29

(Continued)

FOREIGN PATENT DOCUMENTS

CN    112110729 A  * 12/2020
EP    3480280 A1    5/2019
(Continued)

OTHER PUBLICATIONS

English language translation of JP-2017066245-A, Kamata K, Apr. 6, 2017.*

(Continued)

*Primary Examiner* — Bryon T Gyllstrom
(74) *Attorney, Agent, or Firm* — Renner, Otto, Boisselle & Sklar, LLP

(57) ABSTRACT

A light emitting device is a light emitting device for use in a photodynamic therapy. The light emitting device includes: a solid-state light-emitting element that emits primary light in which an energy density is 0.5 W/mm² or more; and a wavelength converter including a first phosphor that emits first wavelength-converted light. The first wavelength-converted light has a light component across at least a whole of a wavelength range of 700 nm or more and less than 800 nm. Energy of fluorescence emitted from the wavelength converter is 100 mW or more. A medical device includes the light emitting device.

7 Claims, 10 Drawing Sheets

(51) Int. Cl.
   *F21Y 115/10*  (2016.01)
   *H01S 5/00*  (2006.01)
   *H10H 20/851*  (2025.01)

(52) U.S. Cl.
   CPC .............. *F21V 9/38* (2018.02); *H01S 5/0087* (2021.01); *H10H 20/8513* (2025.01); *F21Y 2115/10* (2016.08)

(58) Field of Classification Search
   CPC ....... A61B 1/0684; F21V 9/38; H01L 33/504; H01L 33/501; H01L 33/502; H01L 33/505; H01L 33/507; H01S 5/0087; F21Y 2115/10; F21Y 2115/30; C04B 35/01; C04B 2235/3208; C04B 2235/3224; C04B 35/195; C04B 35/597; C04B 2235/3206; C04B 2235/3213; C04B 2235/3225; C04B 2235/3227; C04B 2235/3229; C04B 2235/3241; C04B 2235/652; C04B 2235/6562; C04B 2235/6565; C04B 2235/6567; C04B 2235/6582; C04B 2235/6586; C04B 2235/6587; C04B 2235/72; C04B 2235/9661; A61N 5/0601; A61N 2005/063; A61N 2005/0659; A61N 2005/0662; A61N 5/062
   See application file for complete search history.

(56) References Cited

U.S. PATENT DOCUMENTS

| | | | |
|---|---|---|---|
| 10,411,170 B2 | 9/2019 | Tragl et al. | |
| 2006/0198418 A1 | 9/2006 | Hama et al. | |
| 2009/0167149 A1 | 7/2009 | Ito | |
| 2011/0248624 A1* | 10/2011 | Kishimoto | G02B 6/0006 |
| | | | 313/483 |
| 2013/0030264 A1* | 1/2013 | Gopalakrishnan | H05B 45/12 |
| | | | 250/201.1 |
| 2013/0147343 A1* | 6/2013 | Won | C09K 11/7792 |
| | | | 313/503 |
| 2014/0003074 A1* | 1/2014 | Kishimoto | F21S 45/49 |
| | | | 252/301.36 |
| 2014/0022810 A1 | 1/2014 | Ito et al. | |
| 2015/0055358 A1 | 2/2015 | Nitta et al. | |
| 2015/0346360 A1* | 12/2015 | Yoshikawa | G01T 1/2023 |
| | | | 250/361 R |
| 2017/0051883 A1* | 2/2017 | Raring | H01S 5/2201 |
| 2017/0156187 A1* | 6/2017 | Yamashita | G02F 1/133621 |
| 2018/0216002 A1 | 8/2018 | Nagao et al. | |
| 2018/0346808 A1 | 12/2018 | Nitta et al. | |
| 2018/0358514 A1 | 12/2018 | Tragl et al. | |
| 2019/0088832 A1 | 3/2019 | Onuma et al. | |
| 2019/0194539 A1* | 6/2019 | Rajendran | C09K 11/7707 |
| 2020/0227598 A1* | 7/2020 | Schmidt | C09K 11/7708 |
| 2021/0113076 A1 | 4/2021 | Abe et al. | |

FOREIGN PATENT DOCUMENTS

| | | | |
|---|---|---|---|
| EP | 3 904 488 A1 | 11/2021 | |
| JP | 2006253099 A | 9/2006 | |
| JP | 2009153712 A | 7/2009 | |
| JP | 2012209190 A | 10/2012 | |
| JP | 2015061902 A | 4/2015 | |
| JP | 2016-119999 A1 | 7/2016 | |
| JP | 2017066245 A * | 4/2017 | |
| JP | 2018518046 A | 7/2018 | |
| JP | 2018203983 A | 12/2018 | |
| WO | 2012069542 A1 | 5/2012 | |
| WO | 2017164214 A1 | 9/2017 | |
| WO | 2018/008171 A1 | 1/2018 | |
| WO | 2018008283 A1 | 1/2018 | |
| WO | WO-2019063297 A1 * | 4/2019 | ........ C09K 11/7706 |
| WO | 2019/187637 A1 | 10/2019 | |

OTHER PUBLICATIONS

Extended European Search Report for corresponding EP Application No. 20752368.9 issued Mar. 3, 2022.
International Search Report and Written Opinion of the ISA for corresponding PCT International Application PCT/JP2020/002680, with partial English language translation, 2020.
Chinese Search Report for corresponding Application No. 202080012464.8 issued May 31, 2024, with English translation.

* cited by examiner

LIGHT EMITTING DEVICE AND MEDICAL DEVICE USING SAME

TECHNICAL FIELD

The present invention relates to a light emitting device and a medical device using the light emitting device.

BACKGROUND ART

In recent years, a treatment method for a tumor, which is called photodynamic therapy (PDT), has attracted attention. The photodynamic therapy is a treatment method of administering, to a subject, a photosensitive substance that selectively binds to a tumor, and thereafter, irradiating the photosensitive substance. By irradiating the photosensitive substance that is binding to the tumor, the photosensitive substance emits heat or reactive oxygen species, and accordingly, can destroy the tumor by the heat or the reactive oxygen species. Such a photodynamic therapy is less likely to damage a normal biological tissue, and accordingly, can be said to be a treatment method with less burden on a patient.

In the photodynamic therapy, for example, near-infrared light is used as light to be applied to the photosensitive substance. The near-infrared light is less affected by absorption and scattering thereof by hemoglobin and water in a living body, and accordingly, easily penetrates the living body. Therefore, use of the near-infrared light makes it possible to treat such a tumor present in the living body. Note that light in a wavelength range of 650 nm or more and less than 1400 nm particularly easily penetrates the living body, and this wavelength range is generally called a window of living body.

Patent Literature 1 discloses, as a light emitting device that emits the near-infrared light, a beam radiation-type optoelectronics element using a specific wavelength conversion material. Patent Literature 1 further discloses that this optoelectronics element is used in an endoscope, and that this endoscope is suitable for use in a photodynamic diagnosis and a photodynamic therapy.

CITATION LIST

Patent Literature

Patent Literature 1: Japanese Unexamined Patent Application Publication No. 2018-518046

SUMMARY OF INVENTION

However, in Patent Literature 1, energy of the near-infrared light emitted by the light emitting device using the optoelectronics element is as low as less than 50 mW. Therefore, there has been a problem that the photosensitive substance does not sufficiently function even if the photosensitive substance is irradiated with the near-infrared light emitted from such a light emitting device. Moreover, there has been a problem that, when the energy of the near-infrared light is low, the photosensitive substance present in the depth of the living body is not sufficiently irradiated with the near-infrared light.

The present invention has been made in consideration of such problems as described above, which are inherent in the prior art. Then, it is an object of the present invention to provide a light emitting device capable of radiating near-infrared light that efficiently excites the photosensitive substance, and to provide a medical device using the light emitting device.

In order to solve the above-described problems, a light emitting device according to a first aspect of the present invention is a light emitting device for use in the photodynamic therapy. The light emitting device includes: a solid-state light-emitting element that emits primary light in which an energy density is 0.5 $W/mm^2$ or more; and a wavelength converter including a first phosphor that emits first wavelength-converted light. The first wavelength-converted light has a light component across at least a whole of a wavelength range of 700 nm or more and less than 800 nm. Then, energy of fluorescence emitted from a wavelength converter is 100 mW or more.

A medical device according to a second aspect of the present invention includes the light emitting device according to the first aspect.

DESCRIPTION OF EMBODIMENTS

Figure 1:
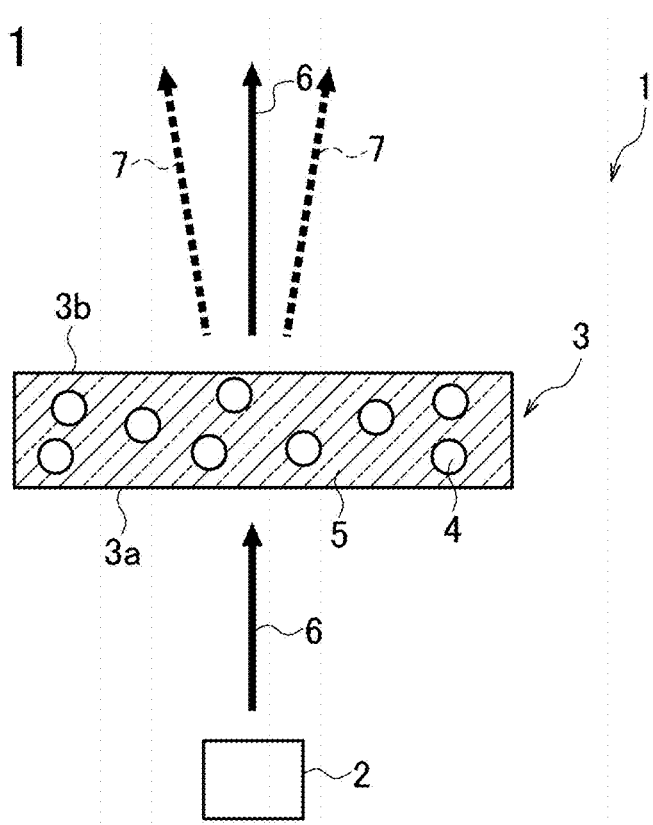
FIG. 1 is a schematic cross-sectional view illustrating an example of a light emitting device according to this embodiment.

Referring to the drawings, a description will be given below of a light emitting device according to this embodiment, a medical device using the light emitting device, and photodynamic therapy. Note that dimensional ratios in the drawings are exaggerated for convenience of explanation, and are sometimes different from actual ratios.

[Light Emitting Device]

The light emitting device according to this embodiment is a light emitting device for use in the photodynamic therapy. As illustrated in FIG. 1 to FIG. 4, each of light emitting devices 1, 1A, 1B and 1C includes at least a solid-state light-emitting element 2 and a wavelength converter 3 or 3A including a first phosphor 4 that emits first wavelength-converted light 7. Each of the light emitting devices 1, 1A, 1B and 1C is a device in which the wavelength converter 3 or 3A radiates fluorescence when primary light 6 radiated from the solid-state light-emitting element 2 enters the wavelength converter 3 or 3A.

(Solid-State Light-Emitting Element)

The solid-state light-emitting element 2 is a light emitting element that radiates the primary light 6. As such a solid-state light-emitting element 2, for example, a laser element such as a surface-emitting laser diode is used. For example, output energy of laser light radiated by one laser element is preferably 0.1 W or more, more preferably 1 W or more, still more preferably 5 W or more. Moreover, for example, an energy density of the laser light radiated by the solid-state light-emitting element 2 is preferably 0.5 $W/mm^2$ or more, more preferably 2 $W/mm^2$ or more, still more preferably 10 $W/mm^2$ or more. As will be described later, a phosphor in each of the wavelength converters 3 and 3A can perform highly efficient wavelength conversion for high-output laser light, and further, is difficult to degrade even for the high-output laser light. Therefore, the fact that the energy density of the laser light radiated by the solid-state light-emitting element 2 is 0.5 $W/mm^2$ enables the light emitting device to radiate high-output near-infrared light.

The solid-state light-emitting element 2 provided in each of the light emitting devices 1, 1A, 1B and 1C may be a light emitting diode (LED). For example, an LED that emits light with energy of 100 mW or more is used as the solid-state light-emitting element 2, whereby the phosphor in each of the wavelength converters 3 and 3A can be excited by high-output light. As a result, each of the light emitting devices 1, 1A, 1B and 1C becomes able to radiate high-output near-infrared light, and becomes able to exert an effect similar to that in the case of using the laser element.

As mentioned above, in each of the light emitting devices 1, 1A, 1B and 1C, it is preferable that the solid-state light-emitting element 2 be at least one of the laser element or the light emitting diode. However, the solid-state light-emitting element 2 is not limited to these, and every light emitting element can be used as long as it is capable of emitting the primary light 6 having a high energy density. Specifically, it is preferable that the solid-state light-emitting element 2 is a light emitting element that emits the primary light 6 in which an energy density is 0.5 $W/mm^2$ or more. In this case, the phosphor in each of the wavelength converters 3 and 3A is excited by the high-output light, and accordingly, each of the light emitting devices 1, 1A, 1B and 1C becomes able to radiate the high-output near-infrared light. Note that the energy density of the primary light emitted by the solid-state light-emitting element 2 is more preferably 2 $W/mm^2$ or more, still more preferably 10 $W/mm^2$. An upper limit of the energy density of the primary light emitted by the solid-state light-emitting element 2 is not particularly limited; however, can be set to 50 $W/mm^2$ for example.

It is preferable that the solid-state light-emitting element 2 radiate the primary light 6 having a maximum intensity value within a wavelength range of 430 nm or more and 480 nm or less. Moreover, it is preferable that the solid-state light-emitting element 2 include a blue laser element as an excitation source to radiate blue primary light 6. Thus, the phosphor in each of the wavelength converters 3 and 3A is excited with high efficiency, and accordingly, the light emitting device becomes able to radiate the high-output near-infrared light.

The solid-state light-emitting element 2 may be an element that radiates the primary light 6 having the maximum intensity value within a wavelength range of 500 nm or more and 560 nm or less. Thus, the phosphor in each of the wavelength converters 3 and 3A can be excited by the high-output primary light 6, and accordingly, the light emitting device becomes able to radiate the high-output near-infrared light.

The solid-state light-emitting element 2 may be an element that radiates the primary light 6 having the maximum intensity value within a wavelength range of 600 nm or more and 700 nm or less. Thus, it becomes possible to excite the phosphor in each of the wavelength converters 3 and 3A by red-series light with relatively low energy, and accordingly, a light emitting device can be obtained, which emits high-output near-infrared light, and in which heat generation due to a Stoke's loss of the phosphor is a little.

As mentioned above, types of the solid-state light-emitting element 2 provided in each of the light emitting devices 1, 1A, 1B and 1C are not particularly limited. However, the number of types of the solid-state light-emitting element 2 provided in each of the light emitting devices 1, 1A, 1B and 1C is preferably three or less, more preferably two or less, still more preferably one. With such a configuration, a simple configuration in which the number of types of the solid-state light-emitting element 2 is small is obtained, and accordingly, compact light emitting devices 1, 1A, 1B and 1C can be obtained.

Note that each of the light emitting devices 1, 1A, 1B and 1C may further include a laser element that does not excite the wavelength converter 3 or 3A. Thus, a light emitting device can be obtained, which is oriented for a medical device that can combine the photodynamic therapy using the near-infrared light emitted by each of the wavelength converters 3 and 3A and another treatment using laser light emitted by a laser element that does not excite each of the wavelength converters 3 and 3A with each other. Note that such another treatment using the laser light emitted by the laser element includes treatment using an optical coherence tomography method, a treatment using a fluorescence imaging method such as an ICG fluorescence imaging method, a treatment using narrow band imaging (NBI), a laser knife treatment, and the like.

With regard to the solid-state light-emitting element provided in each of the light emitting devices 1, 1A, 1B and 1C, it is preferable that a plurality of the solid-state light-emitting elements of the same type be provided. With such a configuration, each of the wavelength converters 3 and 3A can be excited by light with stronger energy, and accordingly, a light emitting device that emits higher-output near-infrared light can be obtained.

(Wavelength Converter)

Figure 2:
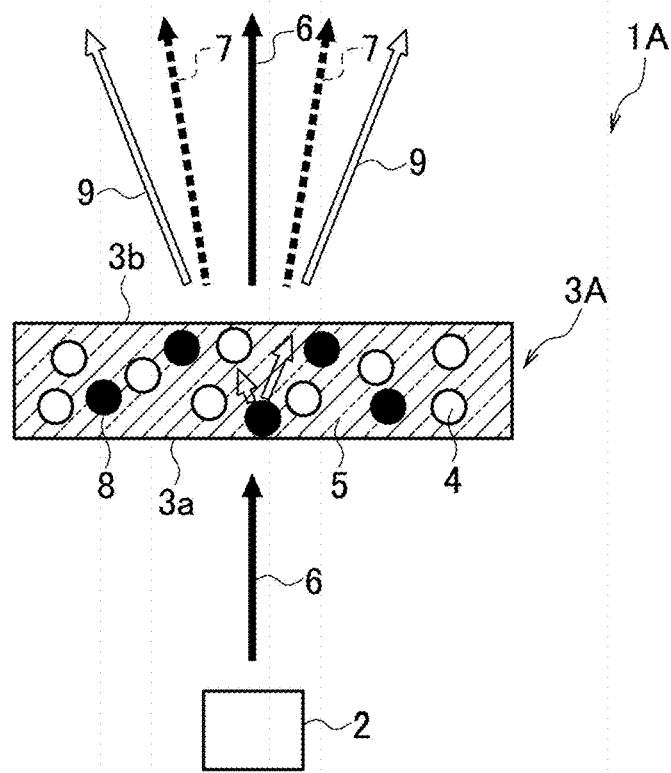
FIG. 2 is a schematic cross-sectional view illustrating another example of the light emitting device according to this embodiment.
Figure 3:
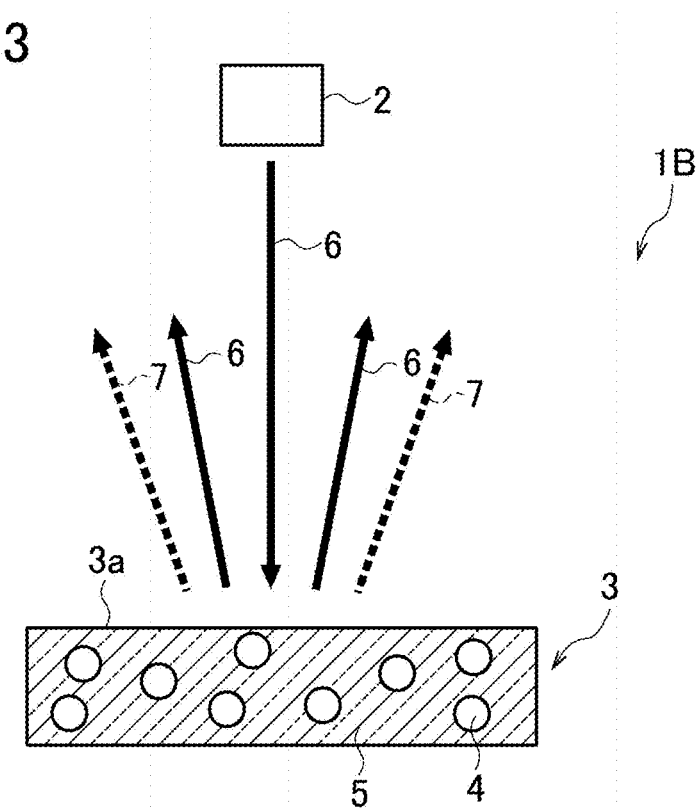
FIG. 3 is a schematic cross-sectional view illustrating still another example of the light emitting device according to this embodiment.
Figure 4:
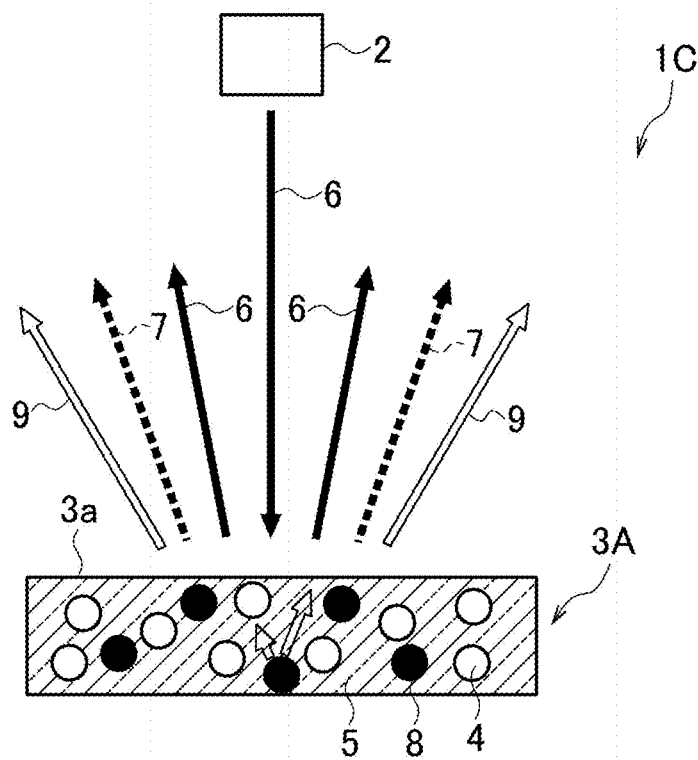
FIG. 4 is a schematic cross-sectional view illustrating yet another example of the light emitting device according to this embodiment.

As illustrated in FIG. 1 to FIG. 4, each of the wavelength converters 3 and 3A receives the primary light 6, thereby radiating fluorescence having a longer wavelength than the primary light 6. Each of the wavelength converters 3 and 3A illustrated in FIG. 1 and FIG. 2 is configured to receive the primary light 6 by a front surface 3a and radiate the fluorescence from a back surface 3b. In contrast, each of the wavelength converters 3 and 3A illustrated in FIG. 3 and FIG. 4 is configured to receive the primary light 6 on a front surface 3a and radiate the fluorescence on the same front surface 3a.

Each of the wavelength converters 3 and 3A includes the first phosphor 4 that receives the primary light 6 and emits the first wavelength-converted light 7, and the first wavelength-converted light 7 is light having a light component across at least the whole of a wavelength range of 700 nm or more and 800 nm or less. Therefore, each of the light emitting devices 1, 1A, 1B and 1C can emit continuous spectrum light having a light component in a wavelength range of at least 700 nm or more and 800 nm or less.

The first phosphor 4 included in each of the wavelength converters 3 and 3A is not particularly limited as long as the first wavelength-converted light 7 has a light component across at least the whole of such a wavelength range of 700 nm or more and 800 nm or less. However, preferably, the first phosphor 4 includes at least one of a $Eu^{2+}$-activated phosphor or a $Ce^{3+}$-activated phosphor. $Ce^{3+}$ and $Eu^{2+}$ take the mechanism of light absorption and emission, which are based on $4f_n \leftrightarrow 4f_{n-1}5d_1$ allowed transition. Therefore, wavelengths of the absorption and the light emission are changed depending on host crystals in which these are activated. Hence, $Ce^{3+}$ or $Eu^{2+}$ is taken as a light emission center, and appropriate host crystals are selected, thus making it possible to obtain a fluorescent component that forms a smooth band spectrum in at least the wavelength range of 700 nm or more and 800 nm or less. Note that, in the above-mentioned $4f_n \leftrightarrow 4f_{n-1}5d_1$ allowed transition, $Ce^{3+}$ applies to n=1, and $Eu^{2+}$ applies to n=7.

It is preferable that the first phosphor 4 include at least a $Cr^{3+}$-activated phosphor. $Cr^{3+}$ takes the mechanism of light absorption and emission, which are based on d-d transition. Therefore, wavelengths of the absorption and the light emission are changed depending on host crystals in which $Cr^{3+}$ is activated. Hence, $Cr^{3+}$ is taken as a light emission center, and appropriate host crystals are selected, thus making it possible to obtain a fluorescent component that forms a smooth band spectrum in at least the wavelength range of 700 nm or more and 800 nm or less.

The first phosphor 4 is preferably an oxide-based phosphor, more preferably an oxide phosphor. Note that the oxide-based phosphor refers to a phosphor that contains oxygen but does not contain nitrogen, and for example, there can be mentioned alkaline earth metal oxide, alkaline earth metal halo-aluminate, and rare earth aluminate, each of which has a calcium ferrite-type structure.

Oxides are stable substances in the atmosphere. Accordingly, even when the oxide phosphors generate heat due to high-density photoexcitation by laser light, such a quality degradation of phosphor crystals as caused in nitride phosphors, which may be caused by oxidation in the atmosphere, is less likely to occur. Therefore, when all of the phosphors included in each of the wavelength converters 3 and 3A are such oxide phosphors, a light emitting device with high reliability can be obtained.

The first phosphor 4 is preferably a nitride-based phosphor, more preferably a nitride phosphor. Moreover, the first phosphor 4 is preferably an oxynitride-based phosphor, more preferably, an oxynitride phosphor. Nitrides have intense covalent bonding properties, and can take a variety of modified examples in terms of composition, and accordingly, can also easily control a fluorescent color and improve temperature quenching. Moreover, nitrides are also excellent in thermal conductivity, and accordingly, are also advantageous in miniaturization of the light emitting device. Therefore, when all of the phosphors included in each of the wavelength converters 3 and 3A are the nitride-based phosphors, color tone control of the light emitted by the light emitting device becomes easy, and it also becomes easy to design a small device.

It is also preferable that the first phosphor 4 have a crystal structure of garnet. Moreover, it is also preferable that the first phosphor 4 be an oxide phosphor having the crystal structure of garnet. Phosphors having such a garnet structure, and particularly oxides having the same have a polyhedral particle shape close to a sphere, and are excellent in dispersibility for a group of phosphor particles. Therefore, when the phosphor included in each of the wavelength converters 3 and 3A has a garnet structure, then a wavelength converter excellent in light transparency becomes relatively easily producible, and it becomes possible to increase the output of the light emitting device. Moreover, since the phosphors having the crystal structure of garnet have been actually used as phosphors for LED, such a highly reliable light emitting device can be obtained in such a manner that the first phosphor 4 has the crystal structure of garnet.

It is preferable that the first phosphor 4 be a phosphor composed based on a compound containing, as a main component, at least one selected from the group consisting of rare earth silicate, rare earth aluminate, rare earth gallate, rare earth scandate, rare earth aluminosilicate, alkaline earth metal aluminonitride silicate, and rare earth nitride silicate. Alternatively, it is preferable that the first phosphor 4 be a phosphor composed based on at least one selected from the group consisting of rare earth silicate, rare earth aluminate, rare earth aluminosilicate, alkaline earth metal aluminonitride silicate, and rare earth nitride silicate. Such a first phosphor 4 as described above is used, whereby a part of the primary light 6 becomes easily convertible into near-infrared light. Therefore, it becomes possible to obtain near-infrared light in which a full width at half maximum of a fluorescence spectrum is large.

Specifically, it is preferable that the first phosphor 4 be a phosphor composed based on a compound (A) containing, as a main component, at least one selected from the group consisting of $RE_2MMg(SiO_4)_3$, $RE_3Al_2(AlO_4)_3$, $RE_3Ga_2(GaO_4)_3$, $RE_3Sc_2(GaO_4)_3$, $RE_3Sc_2(ScO_4)_3$, $RE_3Mg_2(SiO_4)_2(AlO_4)$, $MRE_2O_4$, $MAlSiN_3$, and $RE_3Si_6N_{11}$. Alternatively, it is preferable that the first phosphor 4 be a phosphor composed based on at least one selected from the group consisting of $RE_2MMg(SiO_4)_3$, $RE_3Al_2(AlO_4)_3$, $RE_3Mg_2(SiO_4)_2(AlO_4)$, $MRE_2O_4$, $MAlSiN_3$, and $RE_3Si_6N_{11}$. Alternatively, it is preferable that the first phosphor 4 be a phosphor composed based on a solid solution containing the compound (A) as an end member. Note that M is alkaline earth metal, and RE is a rare earth element.

It is preferable that the first phosphor 4 be composed of ceramics. Thus, heat dissipation of the first phosphor 4 increases, and accordingly, a decrease of the output of the first phosphor 4 due to temperature quenching is suppressed, and a light emitting device that emits the high-output near-infrared light can be obtained.

As mentioned above, in each of the light emitting devices 1, 1A, 1B and 1C, the first wavelength-converted light 7 emitted by the first phosphor 4 is light having a light component across at least the whole of the wavelength range of 700 nm or more and 800 nm or less. Thus, the photosensitive substance can be caused to efficiently function. However, it is more preferable that the first wavelength-converted light 7 have a light component across at least the whole of a wavelength range of 750 nm or more and 800 nm or less. Moreover, it is also preferable that the first wavelength-converted light 7 have a light component across the whole of a wavelength range of 600 nm or more and 800 nm or less. Furthermore, preferably, the first wavelength-converted light 7 emitted by the first phosphor 4 has a fluorescence peak within a wavelength range of 600 nm or more and 1000 nm or less, more preferably, has a fluorescence peak within a wavelength range of 700 nm or more and 1000 nm or less. Thus, a configuration is formed, in which the photosensitive substance can more efficiently absorb the light component in the near-infrared range, which is emitted by the first phosphor 4. Moreover, a configuration is formed, which can deal with various types of photosensitive substances different in light absorption characteristics. Therefore, there can be provided a light emitting device that can deal with various photodynamic therapies and is capable of increasing amounts of the heat and the reactive oxygen species, which are emitted from the photosensitive substance.

In the first wavelength-converted light 7 emitted by the first phosphor 4, a 1/e fluorescence lifetime is preferably 20 ns or more and 1000 μs or less, more preferably 20 ns or more and less than 100 μs. Moreover, in the first wavelength-converted light 7, the 1/e fluorescence lifetime is still more preferably 20 ns or more and less than 2000 ns, particularly preferably 20 ns or more and less than 100 ns. Thus, even when a light density of excitation light that excites the first phosphor 4 is high, an output of such fluorescence emitted by the first phosphor 4 becomes less likely to saturate. Therefore, a light emitting device capable of emitting the high-output near-infrared light can be obtained.

As illustrated in FIG. 1, it is preferable that the wavelength converter 3 further include a sealing material 5, which disperses the first phosphor 4, in addition to the first phosphor 4. Then, in the wavelength converter 3, it is preferable that the first phosphor 4 be dispersed in the sealing material 5. The first phosphor 4 is dispersed in the sealing material 5, whereby it becomes possible to efficiently absorb the primary light 6 emitted by the solid-state light-emitting element 2, and to perform wavelength conversion for the primary light 6 into the near-infrared light. Moreover, it can be made easy to mold the wavelength converter 3 into a sheet shape or a film shape.

Preferably, the sealing material 5 is at least one of an organic material or an inorganic material, and particularly, at least one of a transparent (translucent) organic material or a transparent (translucent) inorganic material. As such a sealing material made of the organic material, for example, a transparent organic material such as a silicone resin is mentioned. As such a sealing material made of the inorganic material, for example, a transparent inorganic material such as low-melting-point glass is mentioned.

As illustrated in FIG. 1 and FIG. 3, the wavelength converter 3 includes the first phosphor 4 that emits the first wavelength-converted light 7. However, it is preferable that, as illustrated in FIG. 2 and FIG. 4, the wavelength converter further include a second phosphor 8 that absorbs the primary light 6 emitted by the solid-state light-emitting element 2 and emits second wavelength-converted light 9 that is visible light. The wavelength converter 3A includes the second phosphor 8, thus making it possible to radiate white output light by additive color mixture of the second wavelength-converted light 9 with the primary light 6 emitted by the solid-state light-emitting element 2, for example, with blue laser light.

The second phosphor 8 included in the wavelength converter 3A is not particularly limited as long as being capable of absorbing the primary light 6 emitted by the solid-state light-emitting element 2 and radiating the second wavelength-converted light 9 that is visible light. It is preferable that the second phosphor 8 be a $Ce^{3+}$-activated phosphor composed based on a compound containing, as a main component, at least one selected from the group of compounds composed of a garnet-type crystal structure, a calcium ferrite-type crystal structure, and a lanthanum silicon nitride ($La_3Si_6N_{11}$)-type crystal structure. Alternatively, it is preferable that the second phosphor 8 be a $Ce^{3+}$-activated phosphor composed based on at least one compound selected from the group of compounds composed of a garnet-type crystal structure, a calcium ferrite-type crystal structure, and a lanthanum silicon nitride-type crystal structure. Such a second phosphor 8 as described above is used, whereby output light that has a large quantity of green to yellow-series light components becomes obtainable.

Specifically, it is preferable that the second phosphor 8 be a $Ce^{3+}$-activated phosphor composed based on a compound (B) containing, as a main component, at least one selected from the group consisting of $M_3RE_2(SiO_4)_3$, $RE_3Al_2(AlO_4)_3$, $MRE_2O_4$, and $RE_3Si_6N_{11}$. Alternatively, it is preferable that the second phosphor 8 be a $Ce^{3+}$-activated phosphor composed based on at least one selected from the group consisting of $M_3RE_2(SiO_4)_3$, $RE_3Al_2(AlO_4)_3$, $MRE_2O_4$, and $RE_3Si_6N_{11}$. Alternatively, it is preferable that the second phosphor 8 be a $Ce^{3+}$-activated phosphor composed based on a solid solution containing the compound (B) as an end member. Note that M is alkaline earth metal, and RE is a rare earth element.

Such a second phosphor 8 as described above absorbs light within the wavelength range of 430 nm or more and 480 nm or less well, and converts the absorbed light into the green to yellow-series light having the maximum intensity value within a wavelength range of 540 nm or more and 590 nm or less highly efficiently. Therefore, such a phosphor as described above is used as the second phosphor 8, whereby a visible light component becomes easily obtainable.

When the wavelength converter 3A includes the first phosphor 4 and the second phosphor 8, it is preferable that the first phosphor 4 emit the first wavelength-converted light 7 by absorbing at least one of the primary light 6 emitted by the solid-state light-emitting element 2 or the second wavelength-converted light 9 emitted by the second phosphor 8. As mentioned above, it is preferable that the first phosphor 4 be a phosphor that absorbs the primary light 6 emitted by the solid-state light-emitting element 2 and emits the first wavelength-converted light 7 that is near-infrared light. However, the first phosphor 4 may be a phosphor that absorbs the second wavelength-converted light 9 emitted by the second phosphor 8 and emits the first wavelength-converted light 7 that is near-infrared light. That is, the second phosphor 8 may be excited by the primary light 6 to radiate the second wavelength-converted light 9, and the first phosphor 4 may be excited by the second wavelength-converted light 9 to radiate the first wavelength-converted light 7. In this case, even if the first phosphor 4 is a phosphor that is hardly excited by the primary light 6, interposition of the second phosphor 8 makes it possible to excite the first phosphor 4 by the fluorescence emitted by the second phosphor 8. Thus, it becomes possible to select, as the first phosphor 4, a phosphor that absorbs visible light, and accordingly, a choice of options for the first phosphor 4 is widened, and a light emitting device easy to industrially produce is formed. Moreover, when the first phosphor 4 absorbs the second wavelength-converted light 9 to emit the first wavelength-converted light 7, a light emitting device is formed, which is capable of emitting the first wavelength-converted light 7 in which a light component intensity of the near-infrared light is large.

It is preferable that each of the wavelength converters 3 and 3A be composed of an inorganic material. Herein, the inorganic material means a material other than organic materials, and is a concept involving ceramics and metals. Each of the wavelength converters 3 and 3A is made of an inorganic material, whereby thermal conductivity thereof is increased in comparison with a wavelength converter including an organic material such as a sealing resin, and accordingly, heat dissipation design can be easily prepared. Therefore, even if the phosphor is subjected to high-density photoexcitation by the primary light 6 radiated from the solid-state light-emitting element 2, a temperature rise of each of the wavelength converters 3 and 3A can be suppressed effectively. As a result, temperature quenching of the phosphor in each of the wavelength converters 3 and 3A is suppressed, and it becomes possible to increase the output of the light emission.

As mentioned above, since it is preferable that each of the wavelength converters 3 and 3A be made of an inorganic material, it is preferable that the sealing material 5 be made of an inorganic material. Moreover, it is preferable to use zinc oxide (ZnO) as such an inorganic material. Thus, the heat dissipation of the phosphor further increases, and accordingly, a decrease of the output of the phosphor due to temperature quenching is suppressed, and it becomes possible to obtain a light emitting device that emits the high-output near-infrared light.

Note that each of the wavelength converters 3 and 3A can also be made as a wavelength converter that does not use the sealing material 5. In this case, particles of the phosphors just need to be adhered to one another by using an organic or inorganic binding agent. Moreover, the particles of the phosphors can also be adhered to one another by using a heating reaction of the phosphors. As the binding agent, there can be used a resin-based adhesive used commonly, or ceramic fine particles, low-melting-point glass or the like. The wavelength converter that does not use the sealing material 5 can be thinned in thickness, and accordingly, can be suitably used for the light emitting device.

Next, functions of the light emitting device according to this embodiment will be described. In the light emitting device 1 illustrated in FIG. 1, first, the primary light 6 radiated from the solid-state light-emitting element 2 is applied to the front surface 3a of the wavelength converter 3. The applied primary light 6 penetrates the wavelength converter 3. Then, when the primary light 6 penetrates the wavelength converter 3, the first phosphor 4 included in the wavelength converter 3 absorbs a part of the primary light 6 and radiates the first wavelength-converted light 7. As described above, light including the primary light 6 and the first wavelength-converted light 7 is radiated as output light from the back surface 3b of the wavelength converter 3.

In the light emitting device 1A illustrated in FIG. 2, first, the primary light 6 radiated from the solid-state light-emitting element 2 is applied to the front surface 3a of the wavelength converter 3A. The applied primary light 6 penetrates the wavelength converter 3A. Then, when the primary light 6 penetrates the wavelength converter 3A, the second phosphor 8 included in the wavelength converter 3A absorbs a part of the primary light 6 and radiates the second wavelength-converted light 9. Moreover, the first phosphor 4 included in the wavelength converter 3A absorbs a part of the primary light 6 and/or the second wavelength-converted light 9 and radiates the first wavelength-converted light 7. As described above, light including the primary light 6, the first wavelength-converted light 7, and the second wavelength-converted light 9 is radiated as output light from the back surface 3b of the wavelength converter 3A.

In the light emitting device 1B illustrated in FIG. 3, first, the primary light 6 radiated from the solid-state light-emitting element 2 is applied to the front surface 3a of the wavelength converter 3. Much of the primary light 6 enters the inside of the wavelength converter 3 from the front surface 3a of the wavelength converter 3, and the rest thereof is reflected on the front surface 3a. In the wavelength converter 3, the first wavelength-converted light 7 is radiated from the first phosphor 4 excited by the primary light 6, and the first wavelength-converted light 7 is radiated from the front surface 3a.

In the light emitting device 1C illustrated in FIG. 4, first, the primary light 6 radiated from the solid-state light-emitting element 2 is applied to the front surface 3a of the wavelength converter 3A. Much of the primary light 6 enters the inside of the wavelength converter 3A from the front surface 3a of the wavelength converter 3A, and the rest thereof is reflected on the front surface 3a. In the wavelength converter 3A, the second wavelength-converted light 9 is radiated from the second phosphor 8 excited by the primary light 6, and the first wavelength-converted light 7 is radiated from the first phosphor 4 excited by the primary light 6 and/or the second wavelength-converted light 9. Then, the first wavelength-converted light 7 and the second wavelength-converted light 9 are radiated from the front surface 3a.

As described above, the light emitting device of this embodiment radiates the first wavelength-converted light 7 having a light component across at least the whole of the wavelength range of 700 nm or more and 800 nm or less, and accordingly, can cause the photosensitive substance, which is administered to the subject, to function efficiently by the first wavelength-converted light 7.

Herein, the photosensitive substance for use in the photodynamic therapy is not particularly limited as long as having an ability to absorb the first wavelength-converted light 7, emit at least one of the heat or the reactive oxygen species, and destroy a tumor. As the photosensitive substance, for example, there can be used at least one selected from the group consisting of a phthalocyanine-based compound, a porphyrin-based compound, a chlorin-based compound, a bacteriochlorin-based compound, a psoralen-based compound, a porfimer sodium-based compound, and a talaporfin sodium-based compound. Note that the photosensitive substance is sometimes called a photosensitive drug, a photosensitive compound, a photosensitizer, a heat generating substance, and the like.

In such a photosensitive substance as described above, light absorption characteristics thereof sometimes change in the subject due to a solvatochromic effect (an effect that a ground state and an excited state change by a change of a solvent polarity) or due to a change of electron withdrawing characteristics caused by association (bonding of the same types of molecules by intermolecular force). Moreover, in the photosensitive substance, the light absorption characteristics thereof sometimes change in the subject also due to differences in types of a functional group, a substitution group, and side chains, which are introduced in order to be accumulated into a region (affected area) of a tumor, and the like. Therefore, when a spectrum width of the light applied to the photosensitive substance is relatively narrow, and a spectrum of the light applied to the photosensitive substance is constant, the change of the light absorption characteristics in the photosensitive substance cannot be dealt with. As a result, in the photosensitive substance, conversion efficiency from light energy to heat energy and generation efficiency of active oxygen have decreased in some cases.

Figure 5:
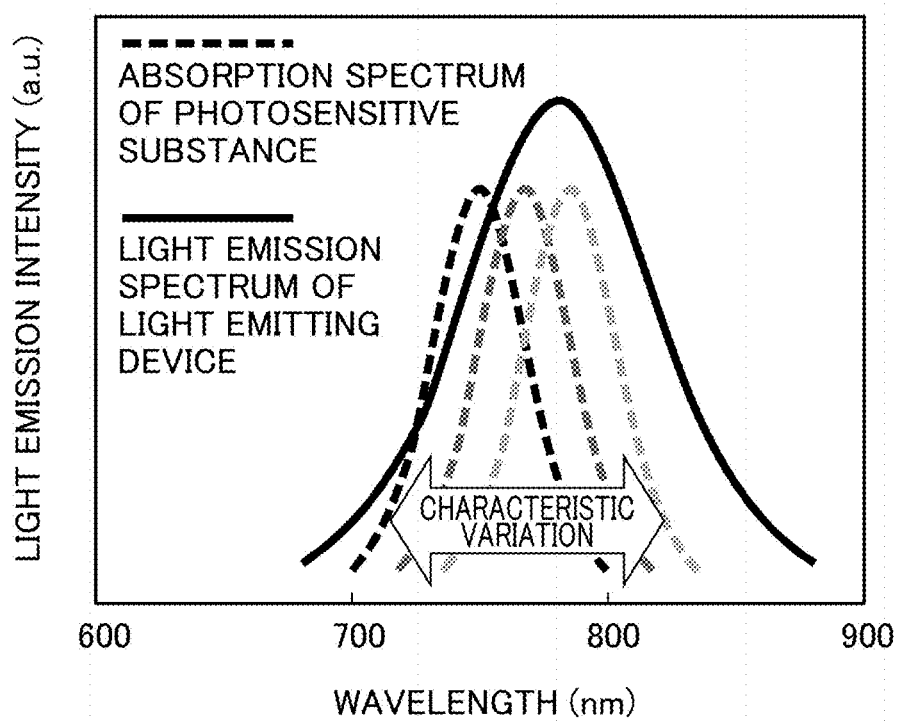
FIG. 5 is a graph abstractly illustrating a relationship between a light emission spectrum of the light emitting device according to this embodiment and an absorption spectrum of a photosensitive substance.

In contrast, the light emitting device according to this embodiment can excite the photosensitive substance highly efficiently even when the light absorption characteristics of the photosensitive substance change. FIG. 5 illustrates a concept of a relationship between a light emission spectrum of the light emitting device according to this embodiment and an absorption spectrum of the photosensitive substance. As mentioned above, in the photosensitive substance, the light absorption characteristics sometimes change due to the solvatochromic effect, the differences in types of the functional group, the substitution group, and the side chains, and the like. That is, as illustrated in FIG. 5, a peak wavelength of the absorption spectrum of the photosensitive substance changes to some extent due to influences of these. However, the light emitting device of this embodiment continuously emits the light component across at least the whole of the wavelength range of 700 nm or more and 800 nm or less. Therefore, even when the light absorption characteristics of the photosensitive substance change, the absorption spectrum of the photosensitive substance and the light emission spectrum of the first wavelength-converted light 7 overlap each other to a large extent. As a result, the photosensitive substance efficiently absorbs the first wavelength-converted light 7, and accordingly, the photosensitive substance is efficiently excited, and becomes able to generate a large amount of heat or reactive oxygen species.

In each of the light emitting devices 1, 1A, 1B and 1C of this embodiment, the energy (radiant flux of fluorescence) of the fluorescence emitted from the wavelength converter 3 is 100 mW or more. That is, the solid-state light-emitting element 2 irradiates the wavelength converter 3 with the primary light 6 in which an energy density is 0.5 W/mm$^2$ or more, and accordingly, the energy of the fluorescence emitted from the wavelength converter 3 becomes 100 mW or more. In this case, the intensity of the first wavelength-converted light 7 emitted from the wavelength converter 3 increases, and accordingly, it becomes possible to excite the photosensitive substance in the subject with higher efficiency, and to cause the photosensitive substance to function sufficiently. Moreover, when the energy of the fluorescence emitted from the wavelength converter 3 is high, it becomes possible to efficiently excite the photosensitive substance present in the depth of the living body, and to cause the photosensitive substance to function. Note that the energy of the fluorescence emitted from the wavelength converter 3 is preferably 300 mW or more, more preferably 500 mW or more, and still more preferably 1 W or more. An upper limit of the energy of the fluorescence emitted from the wavelength converter 3 is not particularly limited; however, can be set to 10 W for example.

As described above, each of the light emitting devices 1, 1A, 1B and 1C of this embodiment is a light emitting device for use in the photodynamic therapy, and includes: the solid-state light-emitting element 2 that emits the primary light 6 in which an energy density is 0.5 W/mm$^2$ or more; and the wavelength converter 3 including the first phosphor 4 that emits the first wavelength-converted light 7. The first wavelength-converted light 7 has a light component across at least the whole of the wavelength range of 700 nm or more and less than 800 nm. Then, the energy of the fluorescence emitted from the wavelength converter 3 is 100 mW or more. Each of the light emitting devices 1, 1A, 1B and 1C radiates light having a light component across at least the whole of the wavelength range of 700 nm or more and 800 nm or less, and accordingly, can excite the photosensitive substance with high efficiency even when the characteristics of the photosensitive substance change. Moreover, since the energy of the fluorescence emitted from the wavelength converter 3 is 100 mW or more, the photosensitive substance can be excited efficiently, and the photosensitive substance can be caused to function sufficiently.

Note that the primary light 6 may be included in the output light of each of the light emitting devices 1, 1A, 1B and 1C. In such a way, such a light emitting device can be obtained, which is oriented for a medical device that can combine the photodynamic therapy and another treatment with each other by using the primary light 6 different in wavelength from the first wavelength-converted light 7. Another treatment includes, for example, a treatment using narrow band imaging. Moreover, the primary light 6 does not have to be included in the output light of each of the light emitting devices 1, 1A, 1B and 1C. In such a way, only the first wavelength-converted light 7 becomes the output light, and a light emitting device can be obtained, which has a small amount of noise component and is suitable for the photodynamic therapy.

It is preferable that the solid-state light-emitting element 2 be a blue laser element that radiates laser light having the maximum intensity value within the wavelength range of 430 nm or more and 480 nm or less. The blue laser element has a higher output than a laser element that emits near-infrared light. Therefore, the blue laser element and each of the wavelength converters 3 and 3A are combined with each other, whereby near-infrared light with a higher output than heretofore can be radiated, and it becomes possible to excite the photosensitive substance in the subject with high efficiency.

In each of the light emitting devices 1A and 1C, it is preferable that the wavelength converter further include the second phosphor 8, which emits the second wavelength-converted light 9 that is visible light, in addition to the first phosphor 4 that emits the first wavelength-converted light 7. Thus, it becomes possible to apply the second wavelength-converted light 9 to a surface of a body tissue, and to observe a state of the surface of the body tissue.

Note that, in each of the light emitting devices 1A and 1C, it is more preferable that the peak wavelength of the fluorescence emitted by the second phosphor 8 stay within a wavelength range of 500 nm or more and 700 nm or less, and that the solid-state light-emitting element 2 include the blue laser element as an excitation source. Thus, the light emitting device can radiate a white light component by the additive color mixture of the second wavelength-converted light 9 emitted by the second phosphor 8 and the blue light component emitted by the solid-state light-emitting element 2. Therefore, it becomes possible to apply the white light component to the surface of the body tissue, and to observe the state of the surface of the body tissue. Moreover, the phosphor that has been actually used highly often can be used as the second phosphor 8, and further, as the solid-state light-emitting element 2, a blue semiconductor laser element can be used, which is easily available from the market, is relatively inexpensive, and has been actually used highly often. Therefore, it becomes possible to easily obtain the light emitting device suitable for industrial production.

Moreover, each of the light emitting devices 1, 1A, 1B and 1C may further include a lens that condenses the first wavelength-converted light 7 and the second wavelength-converted light 9. Thus, the wavelength-converted light emitted from each of the wavelength converters 3 and 3A can be efficiently applied to the affected area, and accordingly, a light emitting device that has higher observation accuracy and therapeutic ability.

As mentioned above, each of the light emitting devices 1, 1A, 1B and 1C can be used for the photodynamic therapy using the photosensitive substance such as the phthalocyanine-based compound, the porphyrin-based compound, the chlorin-based compound, the bacteriochlorin-based compound, the psoralen-based compound, the porfimer sodium-based compound, and the talaporfin sodium-based compound. However, the photodynamic therapy using each of the light emitting devices 1, 1A, 1B and 1C is not limited to these, and each of the light emitting devices 1, 1A, 1B and 1C can be used for a photodynamic therapy using a photosensitive substance having an absorption spectrum in the near-infrared region (for example, a wavelength range of 650 nm or more and less than 1400 nm).

[Medical Device]

Next, a description will be given of a medical device according to this embodiment. A specific description will be given of, as examples of the medical device, an endoscope including a light emitting device, and an endoscope system using the endoscope.

Figure 6:
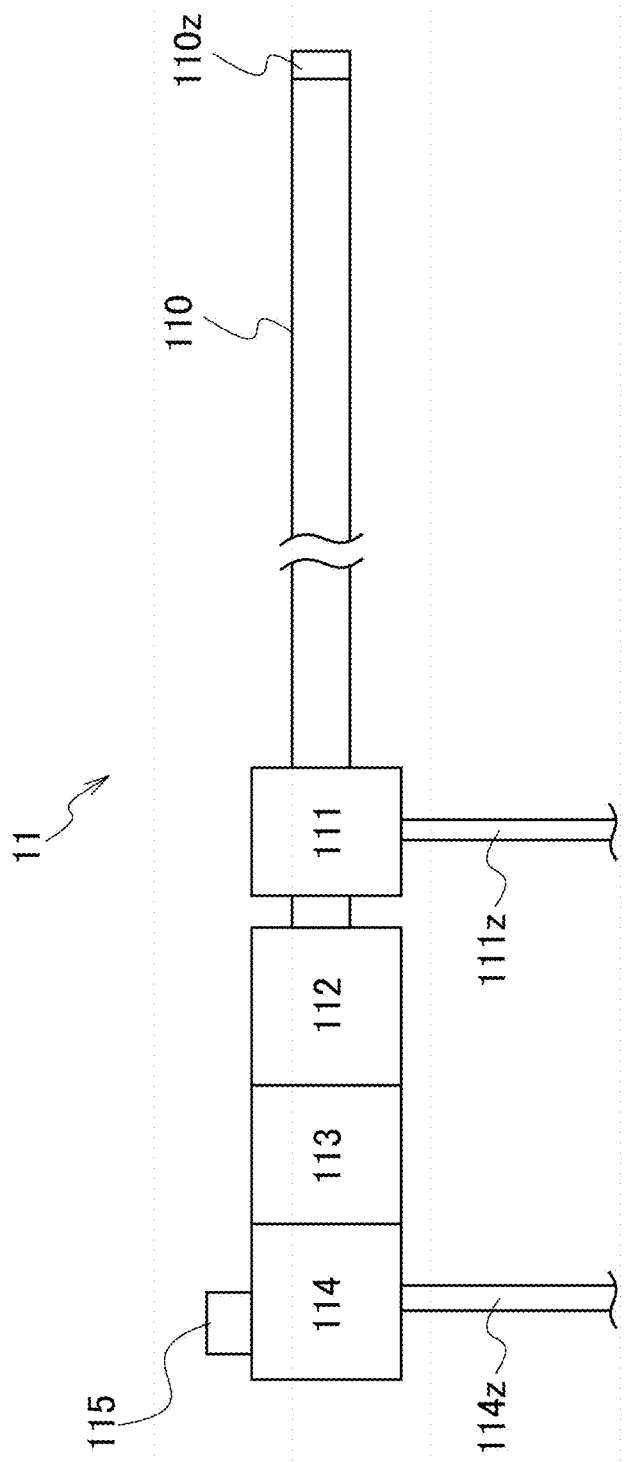
FIG. 6 is a diagram schematically illustrating a configuration of an endoscope according to this embodiment.

The endoscope according to this embodiment includes any of the above-mentioned light emitting devices 1, 1A, 1B and 1C. As illustrated in FIG. 6, an endoscope 11 includes a scope 110, a light source connector 111, a mount adapter 112, a relay lens 113, a camera head 114, and an operation switch 115.

The scope 110 is an elongated light guide member capable of guiding light from a terminal end thereof to a distal end thereof, and is inserted into a body at the time of use. The scope 110 includes an imaging window 110z on the distal end, and an optical material such as optical glass and optical plastics is used for the imaging window 110z. The scope 110 further includes an optical fiber that guides, to the distal end, light introduced from the light source connector 111, and an optical fiber through which an optical image incident from the imaging window 110z is to be transmitted.

The mount adapter 112 is a member for attaching the scope 110 to the camera head 114. A variety of the scopes 110 are freely detachably attached to the mount adapter 112.

From the light emitting device, the light source connector 111 introduces illumination light to be applied to the affected area and the like in the body. In this embodiment, the illumination light includes visible light and near-infrared light. The light introduced into the light source connector 111 is introduced via the optical fiber to the distal end of the scope 110, and is applied from the imaging window 110z to the affected area and the like in the body. Note that, as illustrated in FIG. 6, a transmission cable 111z for guiding the illumination light from the light emitting device to the scope 110 is connected to the light source connector 111. The transmission cable 111z includes the optical fiber.

The relay lens 113 converges optical images, which are to be transferred through the scope 110, onto imaging surfaces of image sensors. Note that the relay lens 113 may adjust a focal point and a magnification by moving a lens in response to an operation amount of the operation switch 115.

The camera head 114 includes a color separation prism in an inside thereof. For example, the color separation prism separates the light, which is converged by the relay lens 113, into red light (R light), green light (G light), and blue light (B light). Note that the color separation prism can further separate the above-described light into near-infrared light (IR light). Thus, such an endoscope 11 that is capable of identifying a lesion region is also achieved, the endoscope 11 using a fluorescence imaging method using the near-infrared light.

The camera head 114 further includes the image sensor as a detector in the inside. The image sensors convert the optical images, which are formed on the respective imaging surfaces, into electrical signals. The image sensors are not particularly limited; however, at least one of charge coupled devices (CCDs) or complementary metal oxide semiconductors (CMOSs) can be used. For example, the image sensors are dedicated sensors which receive pieces of light of a blue component (B component), a red component (R component), and a green component (G component). Note that the camera head 114 may further include a dedicated sensor that receives light of a near-infrared light component (IR component). Thus, such an endoscope 11 that is capable of identifying a lesion region is also achieved, the endoscope 11 using the fluorescence imaging method using the near-infrared light.

In place of the color separation prism, the camera head 114 may include color filters in the inside. The color filters are provided on the imaging surfaces of the image sensors. For example, three color filters are provided, and the three color filters receive the light converged by the relay lens 113, and selectively allow penetration of the red light (R light), the green light (G light), and the blue light (B light). Note that a color filter that selectively allows penetration of the near-infrared light (IR light) is further provided, whereby the endoscope 11 that is capable of identifying a lesion region is also achieved, the endoscope 11 using the fluorescence imaging method using the near-infrared light.

In the case of using the fluorescence imaging method using the near-infrared light, it is preferable that the color filter that selectively allows penetration of the IR light be provided with a barrier film that cuts a reflection component of the near-infrared light (IR light), which is included in the illumination light. Thus, only the fluorescence emitted from the fluorescent drug for use in the fluorescence imaging method and composed of the IR light will form an image on the imaging surface of the image sensor for the IR light. Therefore, it becomes easy to clearly observe an affected area that emits light by the fluorescent drug.

Note that, as illustrated in FIG. 6, to the camera head 114, connected is a signal cable 114z for transmitting the electrical signals, which are output from the image sensors, to a CCU 12 to be described later.

In the endoscope 11 having such a configuration, light from the subject is guided to the relay lens 113 through the scope 110, and further, penetrates the color separation prism in the camera head 114, and forms images on the image sensors.

Figure 7:
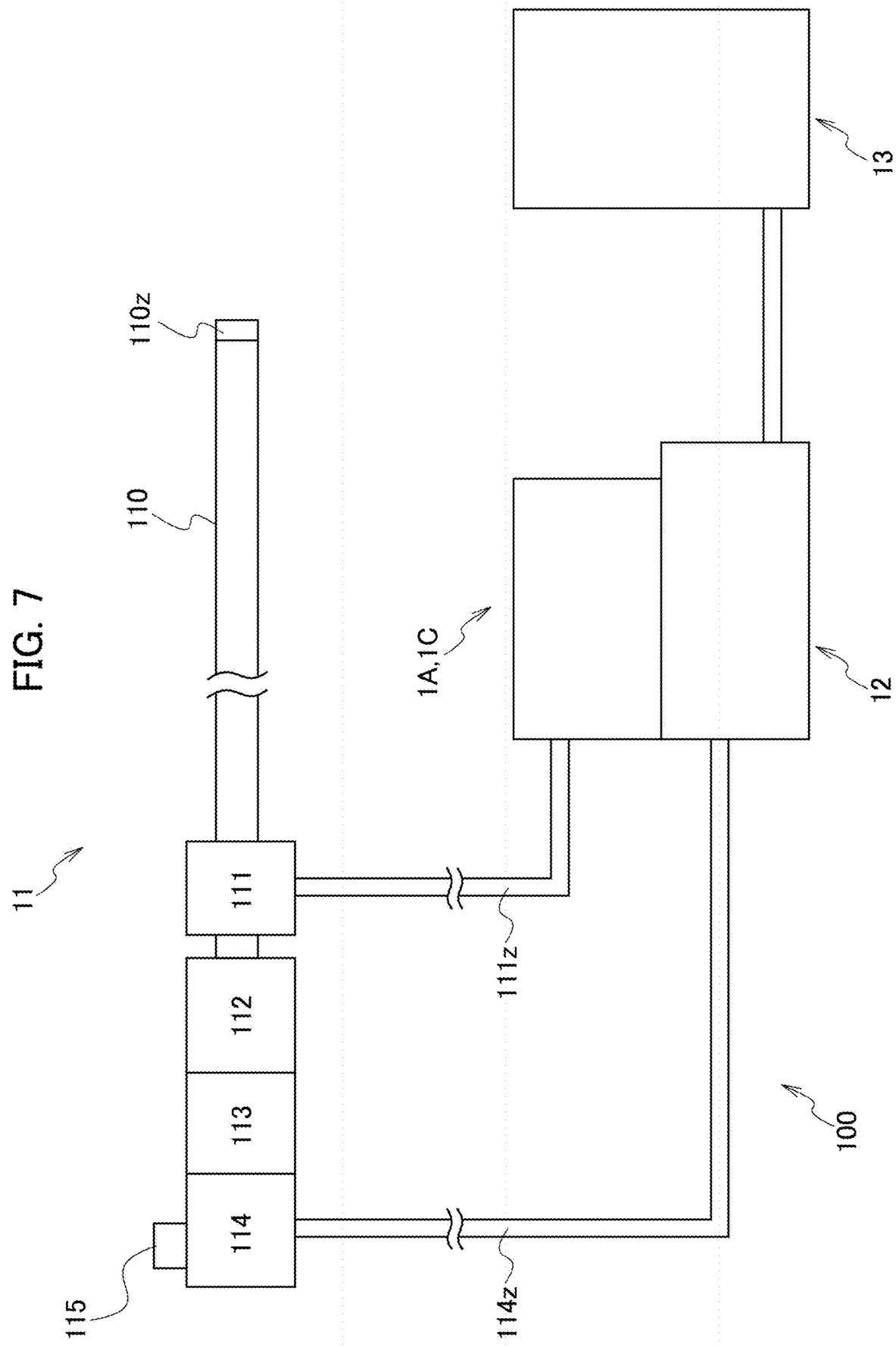
FIG. 7 is a diagram schematically illustrating a configuration of an endoscope system according to this embodiment.

As illustrated in FIG. 7, an endoscope system 100 according to this embodiment includes the endoscope 11 that captures the inside of the subject, the camera control unit (CCU) 12, any of the light emitting devices 1, 1A, 1B and 1C, and a display device 13 such as a display.

The CCU 12 includes at least an RGB signal processing unit, an IR signal processing unit, and an output unit. Then, the CCU 12 executes a program held by a memory in the inside or outside of the CCU 12, thereby achieving the respective functions of the RGB signal processing unit, the IR signal processing unit, and the output unit.

The RGB signal processing unit converts electrical signals of the B component, the R component, and the G component, which are output from the image sensors, into video signals displayable on the display device 13, and outputs the video signals to the output unit. Moreover, the IR signal processing unit converts an electrical signal of the IR component, which is output from the image sensor, into a video signal, and outputs the video signal to the output unit.

The output unit outputs at least either one of the video signals of the respective RGB color components and the video signal of the IR component to the display device 13. For example, the output unit outputs the video signals on the basis of either of a simultaneous output mode and a superposition output mode.

In the simultaneous output mode, the output unit simultaneously outputs an RGB image and an IR image on different screens. By the simultaneous output mode, the RGB image and the IR image can be compared with each other on the different screens, and an affected area can be observed. In the superposition output mode, the output unit outputs a synthetic image in which the RGB image and the IR image are superposed on each other. By the superposition output mode, for example, an affected area, which has emitted light by the fluorescent drug for use in the fluorescence imaging method, can be clearly observed in the RGB image.

On the basis of the video signals output from the CCU 12, the display device 13 displays an image of an object such as an affected area on a screen. In the case of the simultaneous output mode, the display device 13 divides the screen into a plurality of screens, and displays the RGB image and the IR image on the respective screens side by side. In the case of the superposition output mode, the display device 13 displays, by one screen, the synthetic image in which the RGB image and the IR image are superposed on each other.

As mentioned above, the endoscope 11 according to this embodiment includes any of the light emitting devices 1, 1A, 1B and 1C, and radiates the first wavelength-converted light 7 from the imaging window 110z of the scope 110. Therefore, use of the endoscope 11 makes it possible to efficiently excite the photosensitive substance accumulated into the affected area in the body, and to cause the photosensitive substance to function sufficiently.

Moreover, when the endoscope 11 includes any of the light emitting devices 1A and 1C including the second phosphor 8, the endoscope 11 radiates the second wavelength-converted light 9 that is visible light in addition to the first wavelength-converted light 7. Therefore, use of the endoscope system 100 makes it possible to apply the first wavelength-converted light 7 to the affected area while identifying a position of the affected area.

As described above, the medical device of this embodiment includes any of the light emitting device 1, 1A, 1B and 1C. However, the medical device is not limited to the endoscope and the endoscope system, and the light emitting devices 1, 1A, 1B and 1C can be applied to every medical device for use in the photodynamic therapy. For example, the light emitting devices 1, 1A, 1B and 1C can also be used for a light source device that is used for the photodynamic therapy and applies the near-infrared light to the subject from the outside thereof.

[Photodynamic Therapy]

Next, a description will be given of a photodynamic therapy according to this embodiment. The photodynamic therapy of this embodiment is a method using each of the light emitting devices 1, 1A, 1B and 1C or the medical device, which is mentioned above. Specifically, the photodynamic therapy of this embodiment includes the steps of: identifying the position of the lesion region; administering the photosensitive substance to the subject; and applying the first wavelength-converted light 7 to the lesion region with which the photosensitive substance comes into contact.

The photodynamic therapy of this embodiment first identifies a position of a lesion region of a patient who is the subject. For identifying the position of the lesion region, for example, the fluorescence imaging method can be used. The fluorescence imaging method is a method for grasping the presence or absence and position of a tumor in such a manner that a fluorescent drug is administered to the subject and specifically accumulated on a tumor or the like in the subject, and thereafter, the fluorescent drug is excited by light with a specific wavelength, and fluorescence radiated from the fluorescent drug is captured.

Next, the photosensitive substance is administered to the subject, and the photosensitive substance is specifically accumulated on the affected area. As the photosensitive substance to be administered to the subject, as mentioned above, such a substance can be used, which absorbs light in the near-infrared region, and generates heat and reactive oxygen species. Note that timing of administering the photosensitive substance to the subject may be before identifying the position of the lesion region.

Then, the first wavelength-converted light 7 is applied to the lesion region with which the photosensitive substance comes into contact. As mentioned above, the first wavelength-converted light 7 has a light component across at least the whole of the wavelength range of 700 nm or more and 800 nm or less, and the energy thereof is 100 mW or more. Then, the light in the near-infrared region is difficult to be scattered by hemoglobin and water in a living body, and is easy to penetrate the living body, and accordingly, the first wavelength-converted light 7 penetrates the living body and intensely excites the photosensitive substance. The excited photosensitive substance generates heat and reactive oxygen species, and destroys the tumor with which the photosensitive substance comes in contact.

As mentioned above, the first wavelength-converted light 7 has a light component across at least the whole of the wavelength range of 700 nm or more and 800 nm or less, and accordingly, can excite the photosensitive substance with high efficiency even when the characteristics of the photosensitive substance change. Moreover, since the first wavelength-converted light 7 has energy as high as 100 mW or more, it becomes possible to excite the photosensitive substance present in the depth of the living body, and to cause the photosensitive substance to function sufficiently.

Such a method for identifying the position of the lesion region is not limited to the fluorescence imaging method. For example, the position of the lesion region may be identified by narrow band imaging and image analysis. Moreover, at the time of a surgery, the position of the lesion region may be visually grasped. In this case, light radiated from the light emitting device may be directly applied to the lesion region without interposing optical fiber and the like therebetween. Moreover, the light radiated from the light emitting device may be applied to the lesion region by using a fiber-type device that interposes the optical fiber and the like therebetween. Note that, even in the surgery, the fluorescence imaging method, the narrow band imaging and the image analysis can be used at the time of identifying the position of the lesion region.

Herein, the lesion region of the patient also includes new blood vessels as well as the tumor. The new blood vessels are vessels formed specifically around the tumor, and have a function to promote growth and metastasis of the tumor. The photodynamic therapy of this embodiment may specifically accumulate the photosensitive substance in the new blood vessels and destroy the new blood vessels.

The photodynamic therapy of this embodiment may destroy regulatory T cells. The regulatory T cells are cells which govern immunological tolerance, and in the surrounding environment of the tumor, the regulatory T cells are activated and inhibit the action of an immune system to the tumor. Therefore, by the photodynamic therapy, the photosensitive substance is specifically accumulated in the regulatory T cells to destroy the regulatory T cells, and the action of the immune system is activated, whereby the tumor can be treated. Such a treatment method is sometimes called photoimmunotherapy.

EXAMPLES

A more detailed description will be given below of the light emitting device of this embodiment by examples; however, this embodiment is not limited to these.

Preparation of Phosphor

Example 1

An oxide phosphor for use in Example 1 was synthesized by using a preparation method using a solid phase reaction. The phosphor of Example 1 is an oxide phosphor represented by a composition formula of $(Y_{0.98}Ce_{0.02})_3Mg_2(AlO_4)(SiO_4)_2$. Note that the following compound powders were used as main raw materials at the time of synthesizing the oxide phosphor.

Yttrium oxide ($Y_2O_3$): purity 3N, Shin-Etsu Chemical Co., Ltd.
Cerium oxide ($CeO_2$): purity 4N, Shin-Etsu Chemical Co., Ltd.
Aluminum oxide ($\theta$-$Al_2O_3$): purity>4N5, Sumitomo Chemical Co., Ltd.
Magnesium oxide (MgO): purity 4N, Kojundo Chemical Laboratory Co., Ltd.
Silicon dioxide ($SiO_2$): purity>3N, Nippon Aerosil Co., Ltd.

Note that, for the purpose of improving reactivity between the raw materials, AKP-G008 made by Sumitomo Chemical Co., Ltd. was used as aluminum oxide. Moreover, in the example, the following compound powders were used as reaction accelerators.

Aluminum fluoride ($AlF_3$): purity 3N, Kojundo Chemical Laboratory Co., Ltd.
Calcium carbonate ($K_2CO_3$): purity 2N5, Kanto Chemical Co., Inc.

First, the above-described raw materials were weighed so as to obtain a compound with a stoichiometric composition, which is $(Y_{0.98}Ce_{0.02})_3Mg_2(AlO_4)(SiO_4)_2$ with a stoichiometric composition. Next, by using a ball mill, the weighed raw materials and a trace amount of the reaction accelerators were wet-mixed together with an appropriate amount of water (pure water) sufficiently. The mixed raw materials thus obtained were transferred to a container, and were dried all night at 120° C. by using a dryer. Then, the mixed raw material already dried was pulverized by using a mortar and a pestle, and was prepared as a raw material to be fired.

The above-described raw material to be fired was transferred to a small alumina crucible attached with a cover, and was fired for 4 hours in an atmosphere of 1600° C. by using a box-type electric furnace, and thereafter, a fired product was lightly disintegrated. The disintegrated fired product was transferred to the small alumina crucible one more time. Next, the small alumina crucible that contained the fired product was put into the inside of a little larger alumina crucible that contains carbon, and the crucible was closed. Then, the alumina crucible was fired at 1400° C. for 2 hours by using a box-type electric furnace. As described above, the fired product was subjected to reduction treatment by CO gas generated by the firing at 1400° C., whereby a phosphor of this example was obtained. A color of the obtained phosphor was dark orange. Note that post-treatment was omitted due to experimental reasons.

Example 2, Example 3

Nitride phosphors for use in Example 2 and Example 3 were synthesized by using a preparation method using a solid phase reaction. The phosphor of Example 2 is a nitride phosphor represented by a composition formula of $La_{2.991}Ce_{0.009}(Si,Al)_6(N,O)_{11-x}$. Moreover, the phosphor of Example 3 is a nitride phosphor represented by a composition formula of $La_{2.982}Ce_{0.012}(Si,Al)_6(N,O)_{11-x}$.

At the time of synthesizing the nitride phosphors, lanthanum nitride (III)(LaN), silicon nitride powder ($Si_3N_4$), aluminum nitride powder (AlN), and cerium fluoride powder ($CeF_3$) were used as main raw materials.

First, the above-described raw materials were weighed so as to form compounds with stoichiometric compositions, which are $La_{2.991}Ce_{0.009}(Si,Al)_6(N,O)_{11-x}$ and $La_{2.982}Ce_{0.012}(Si,Al)_6(N,O)_{11-x}$. However, the LaN powder was weighed to an amount larger by 24% than a stoichiometric value thereof.

Next, the weighed raw materials were dry-mixed with one another by using a mortar in a glove box under a nitrogen atmosphere. Mixed raw materials thus obtained were put into a crucible made of boron nitride, and were fired at 1900° C. for 2 hours under a nitrogen atmosphere of 0.5 MPa. Then, fired products were washed for 1 hour in a nitric acid solution with a concentration of 10%. Thus, the phosphors of Example 2 and Example 3 were obtained.

Example 4

An oxide phosphor for use in Example 4 was synthesized by using a preparation method using a solid phase reaction. The phosphor of Example 4 is an oxide phosphor represented by a composition formula of $(Ca_{0.1}Sr_{0.897}Eu_{0.003})Sc_2O_4$. Note that the following compound powders were used as main raw materials at the time of synthesizing the oxide phosphor.

Calcium carbonate ($CaCO_3$): purity 3N, Wako Pure Chemical Industries, Ltd.
Strontium carbonate ($SrCO_3$): purity 3N, Wako Pure Chemical Industries, Ltd.
Scandium oxide ($Sc_2O_3$): purity 3N, Shin-Etsu Chemical Co., Ltd.
Europium oxide ($Eu_2O_3$): purity 3N, Shin-Etsu Chemical Co., Ltd.

First, the above-described raw materials were weighed so as to obtain a compound with a stoichiometric composition, which is $(Ca_{0.1}Sr_{0.897}Eu_{0.003})Sc_2O_4$. Next, the weighed raw materials were put into a beaker into which pure water was poured, and were stirred for 1 hour by using a stirrer. Thus, a slurry-like mixed raw material made of pure water and the raw materials was obtained. Thereafter, the slurry-like mixed raw material was fully dried by using a dryer. Then, the mixed raw material already dried was pulverized by using a mortar and a pestle, and was prepared as a raw material to be fired.

The above-described raw material to be fired was transferred to a small alumina crucible, and was subjected to reduction treatment for 1 hour in an atmosphere of 1500° C. reducing gas (96 vol % $N_2$+4 vol % $H_2$) by using a tubular atmosphere furnace, whereby a phosphor of this example was obtained. Note that a flow rate of the reducing gas was set to 1 L/min, and a heating/cooling rate was set to 300° C./h.

A color of the obtained phosphor was light purple. This suggests that the phosphor of Example 4 absorbs visible light other than violet light (for example, the visible light is blue light, green light, yellow light, and red light) relatively intensely.

Example 5

A nitride phosphor for use in Example 5 was synthesized by using a preparation method using a solid phase reaction. The phosphor of Example 5 is a nitride phosphor represented by a composition formula of $(La_{0.896}Gd_{0.1}Ce_{0.004})_3(Si,Al)_6(N,O)_{11-x}$.

At the time of synthesizing the nitride phosphor, lanthanum nitride (III) (LaN), gadolinium nitride (III) (GdN), silicon nitride powder ($Si_3N_4$), aluminum nitride powder (AlN), and cerium nitride powder (CeN) were used as main raw materials.

First, the above-described raw materials were weighed so as to form a compound with a stoichiometric composition, which is $(La_{0.896}Gd_{0.1}Ce_{0.004})_3(Si,Al)_6(N,O)_{11-x}$. Next, the weighed raw materials were dry-mixed with one another by using a mortar in a glove box under a nitrogen atmosphere. A mixed raw material thus obtained was put into a crucible made of boron nitride, and was fired at 1900° C. for 2 hours under a nitrogen atmosphere of 0.5 MPa. Then, a fired product was washed for 1 hour in a nitric acid solution with a concentration of 10%. Thus, the phosphor of Example 5 was obtained. A color of the obtained phosphor was light red.

Example 6

An oxide phosphor for use in Example 6 was synthesized by using a preparation method using a solid phase reaction. The phosphor of Example 6 is an oxide phosphor represented by a composition formula of $Gd_3(Ga_{0.97}Cr_{0.03})_2Ga_3O_{12}$. Moreover, the phosphor of Example 6 is a $Cr^{3+}$-activated phosphor. Note that the following compound powders were used as main raw materials at the time of synthesizing the oxide phosphor of Example 6.

Gadolinium oxide ($Gd_2O_3$): purity 3N, Wako Pure Chemical Industries, Ltd.
Gallium oxide ($Ga_2O_3$): purity 4N, Wako Pure Chemical Industries, Ltd.
Chromium oxide ($Cr_2O_3$): purity 3N, Kojundo Chemical Laboratory Co., Ltd.

First, the above-described raw materials were weighed so as to obtain a compound with a stoichiometric composition, which is $Gd_3(Ga_{0.97}Cr_{0.03})_2Ga_3O_{12}$. Next, the weighed raw materials were put into a beaker into which pure water was poured, and were stirred for 1 hour by using a stirrer. Thus, a slurry-like mixed raw material made of pure water and the raw materials was obtained. Thereafter, the slurry-like mixed raw material was fully dried by using a dryer. Then, the mixed raw material already dried was pulverized by using a mortar and a pestle, and was prepared as a raw material to be fired.

The above-described raw material to be fired was transferred to a small alumina crucible, and was fired for 1 hour in the atmosphere of 1500° C. by using a box-type electric furnace, whereby a phosphor of this example was obtained. Note that a heating/cooling rate was set to 400° C./h. A color of the obtained phosphor was dark green.

Example 7

An oxide phosphor for use in Example 7 was synthesized by using a preparation method using a solid phase reaction. The phosphor of Example 7 is an oxide phosphor represented a composition by formula of $(Gd_{0.75}La_{0.25})_3(Ga_{0.97}Cr_{0.03})_2Ga_3O_{12}$. Moreover, the phosphor of Example 7 is a $Cr^{3+}$-activated phosphor. Then, the following compound powders were used as main raw materials at the time of synthesizing the oxide phosphor of Example 7.

Gadolinium oxide ($Gd_2O_3$): purity 3N, Wako Pure Chemical Industries, Ltd.
Lanthanum oxide ($La_2O_3$): purity 3N, Wako Pure Chemical Industries, Ltd.
Gallium oxide ($Ga_2O_3$): purity 4N, Wako Pure Chemical Industries, Ltd.
Chromium oxide ($Cr_2O_3$): purity 3N, Kojundo Chemical Laboratory Co., Ltd.

First, the above-described raw materials were weighed so as to obtain a compound with a stoichiometric composition, which is $(Gd_{0.75}La_{0.25})_3(Ga_{0.97}Cr_{0.03})_2Ga_3O_{12}$. Next, the weighed raw materials were put into a beaker into which pure water was poured, and were stirred for 1 hour by using a stirrer. Thus, a slurry-like mixed raw material made of pure water and the raw materials was obtained. Thereafter, the slurry-like mixed raw material was fully dried by using a dryer. Then, the mixed raw material already dried was pulverized by using a mortar and a pestle, and was prepared as a raw material to be fired.

The above-described raw material to be fired was transferred to a small alumina crucible, and was fired for 1 hour in the atmosphere of 1450° C. by using a box-type electric furnace, whereby a phosphor of this example was obtained. Note that a heating/cooling rate was set to 400° C./h. A color of the obtained phosphor was dark green.

[Evaluation]
(Crystal Structure Analysis)

A crystal structure of the phosphor of Example 1 was evaluated by using an X-ray diffractometer (X'PertPRO; made by PANalytical Ltd. in Spectris Co., Ltd.).

Although details are omitted, as a result of the evaluation, it has been found out that the phosphor of Example 1 is composed by containing, as a main component, a compound having a crystal structure of garnet. That is, it has been found out that the phosphor of Example 1 is a garnet phosphor. In such a way, it was confirmed that the phosphor of Example 1 is $(Y_{0.98}Ce_{0.02})_3Mg_2(AlO_4)(SiO_4)_2$ as a compound.

Next, crystal structures of the phosphors of Example 2 and Example 3 were evaluated by using an X-ray diffractometer (RINT2100; made by Rigaku Corporation).

Although details are omitted, as a result of the evaluation, it has been found out that each of the phosphors of Example 2 and Example 3 is composed by containing, as a main component, a compound having a tetragonal crystal system. Then, it has been found out that each of the phosphors of Example 2 and Example 3 has almost the same crystal structure as a crystal of nitride represented by a general formula $La_3Si_6N_{11}$. That is, it has been found out that the phosphors of Example 2 and Example 3 are nitride phosphors. In such a way, it was confirmed that the phosphors of Example 2 and Example 3 are $La_{2.991}Ce_{0.009}(Si,Al)_6(N,O)_{11-x}$, and $La_{2.982}Ce_{0.012}(Si,Al)_6(N,O)_{11-x}$ as compounds, respectively.

Next, a crystal structure of the phosphor of Example 4 was evaluated by using an X-ray diffractometer (MiniFlex; made by Rigaku Corporation).

Figure 8:
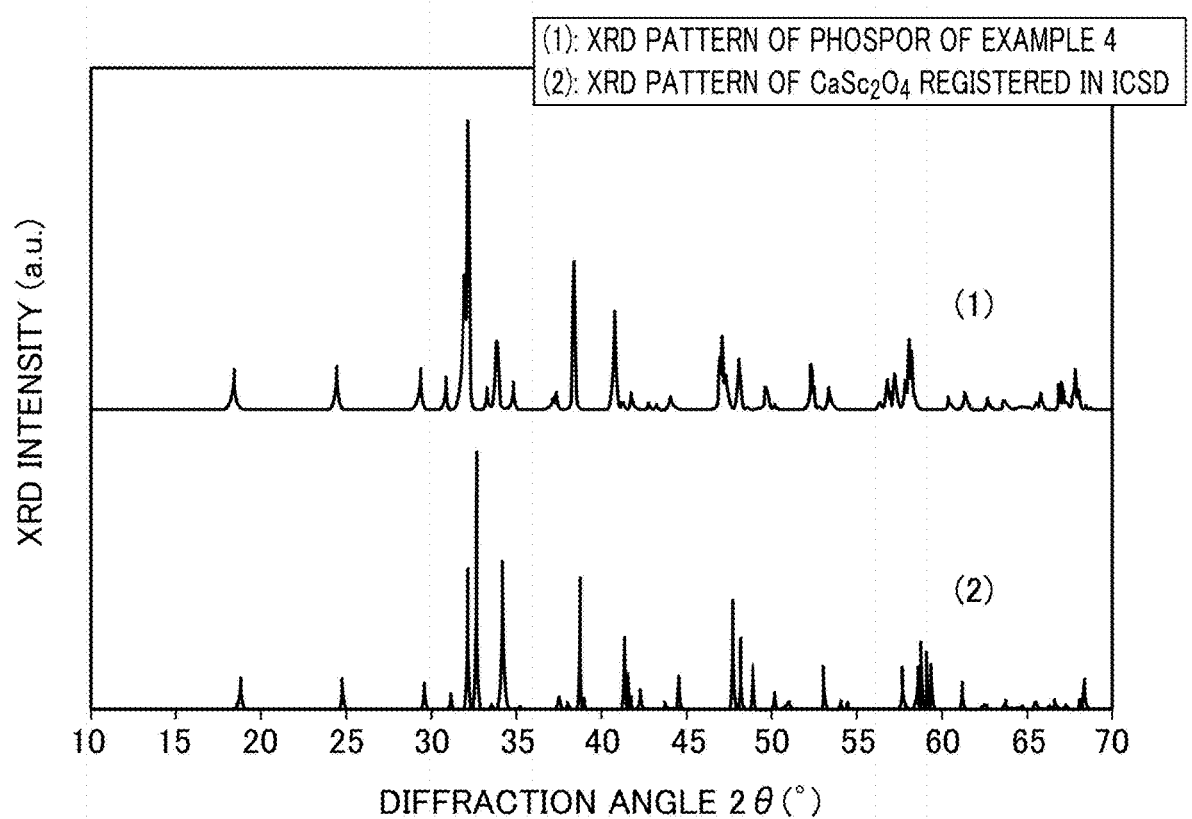
FIG. 8 is a graph illustrating an X-ray diffraction pattern of a phosphor used in a light emitting device of Example 4 and a pattern of $CaSc_2O_4$ registered in ICSD.

FIG. 8 illustrates an X-ray diffraction (XRD) pattern of the phosphor of Example 4 ((1) in FIG. 8). For reference, FIG. 8 also illustrates a pattern of $CaSc_2O_4$, which is registered in the Inorganic Crystal structure Database (ICSD) ((2) in FIG. 8). As seen from FIG. 8, an XRD pattern of the phosphor of Example 4 coincided with the pattern of $CaSc_2O_4$, which is registered in the ICSD. This represents that the phosphor of Example 4 is a compound having a calcium ferrite-type crystal structure that is the same as that of $CaSc_2O_4$.

Note that a diffraction peak of the phosphor of Example 4 was located on a low angle side in comparison with a diffraction peak of $CaSc_2O_4$, which is registered in the ICSD. A low angle shift of the diffraction peak indicates an increase of a lattice interplanar spacing value (d value) of the crystal. Therefore, this result suggests that $Sr^{2+}$ (ionic radius: 1.26 Å; coordination: 8) was substituted for a part of $Ca^{2+}$ (ionic radius: 1.12 Å; coordination: 8) of a $CaSc_2O_4:Eu^{2+}$ phosphor, and that a lattice interval of the crystal was increased. From the above result, Example 4 is regarded as an oxide phosphor represented by a composition formula of $(Ca_{0.1}Sr_{0.897}Eu_{0.003})Sc_2O_4$.

Next, a crystal structure of the phosphor of Example 5 was evaluated by using an X-ray diffractometer (MiniFlex; made by Rigaku Corporation).

Although details are omitted, as a result of the evaluation, it has been found out that the phosphor of Example 5 is composed by containing, as a main component, a compound having a tetragonal crystal system. Then, it has been found out that the phosphor of Example 5 has almost the same crystal structure as a crystal of nitride represented by a general formula $La_3Si_6N_{11}$. That is, it has been found out that the phosphor of Example 5 is a nitride phosphor. In such a way, it was confirmed that the phosphor of Example 5 is $(La_{0.896}Gd_{0.1}Ce_{0.004})_3(Si,Al)_6(N,O)_{11-x}$ as a compound.

Next, a crystal structure of the phosphor of Example 6 was evaluated by using an X-ray diffractometer (MiniFlex; made by Rigaku Corporation).

Although details are omitted, as a result of the evaluation, it has been found out that the phosphor of Example 6 is composed by containing, as a main component, a compound having a crystal structure of garnet. That is, it has been found out that the phosphor of Example 6 is a garnet phosphor. In such a way, it was confirmed that the phosphor of Example 6 is $Gd_3(Ga_{0.97}Cr_{0.03})_2Ga_3O_{12}$ as a compound.

Next, a crystal structure of the phosphor of Example 7 was evaluated by using an X-ray diffractometer (MiniFlex; made by Rigaku Corporation).

Although details are omitted, as a result of the evaluation, it has been found out that the phosphor of Example 7 is composed by containing, as a main component, a compound having a crystal structure of garnet. That is, it has been found out that the phosphor of Example 7 is a garnet phosphor. In such a way, it was confirmed that the phosphor of Example 7 is $(Gd_{0.75}La_{0.25})_3(Ga_{0.97}Cr_{0.03})_2Ga_3O_{12}$ as a compound.

(Spectral Characteristics)

Figure 9:
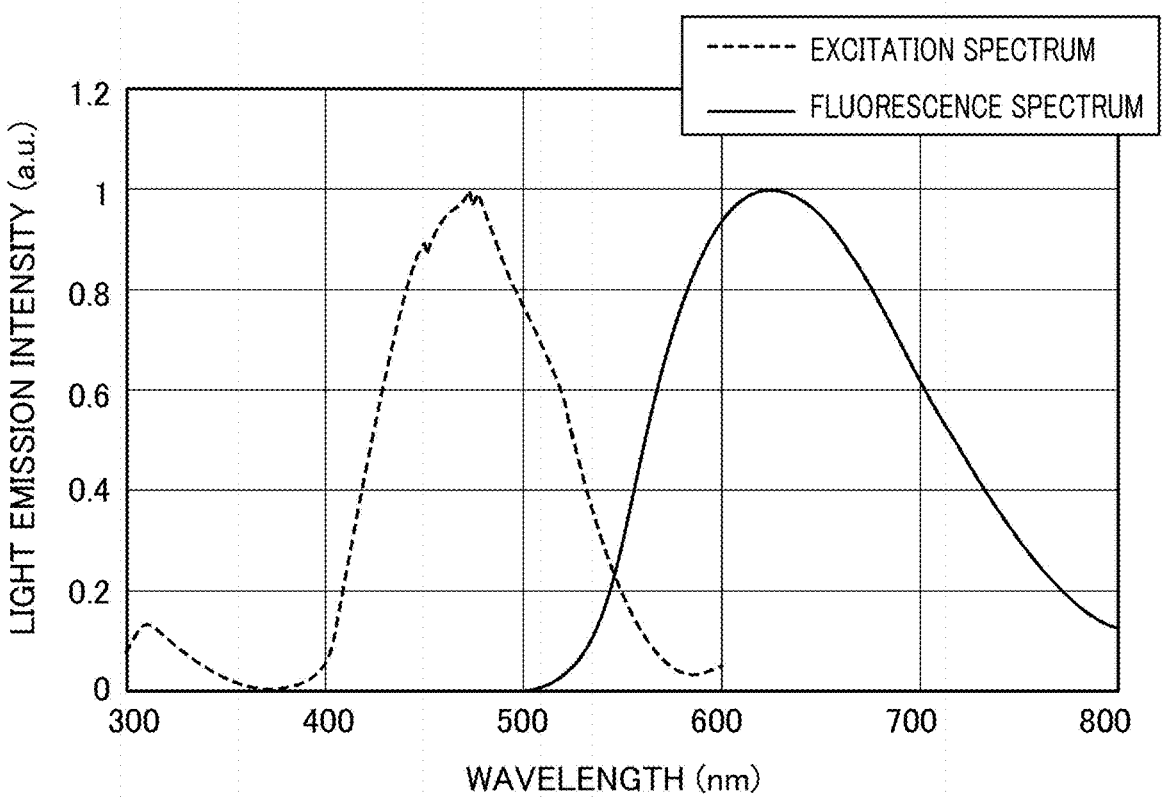
FIG. 9 is a graph illustrating an excitation spectrum and light emission spectrum of a phosphor used in a light emitting device of Example 1.

Next, excitation characteristics and fluorescence characteristics of the phosphor of Example 1 were evaluated by using a spectrophotofluorometer (FP-6500; made by JASCO Corporation). FIG. 9 illustrates an excitation spectrum and fluorescence spectrum of the phosphor of Example 1. Note that an excitation wavelength at the time of measuring the fluorescence spectrum was set to 450 nm, and a monitor wavelength at the time of measuring the excitation spectrum was set to a fluorescence peak wavelength. Moreover, in FIG. 9, both of the fluorescence spectrum and the excitation spectrum are standardized and shown while taking peak values thereof as 1.

The fluorescence spectrum of the phosphor of Example 1 was a broad spectrum that can be regarded to result from the $5d^1 \rightarrow 4f^1$ transition of $Ce^{3+}$. Then, the fluorescence spectrum of the phosphor of Example 1 formed a band spectrum across the whole of the wavelength range of 600 nm or more and 800 nm or less.

Note that peak wavelengths of the fluorescence spectrum and excitation spectrum of the phosphor of Example 1 were 625 nm and 473 nm, respectively. This represents that the phosphor of Example 1 can efficiently absorb blue light with a wavelength of around 430 to 480 nm and can perform wavelength conversion for the absorbed blue light into fluorescence that forms a band spectrum across the whole of the wavelength range of 600 nm or more and 800 nm or less.

Figure 10:
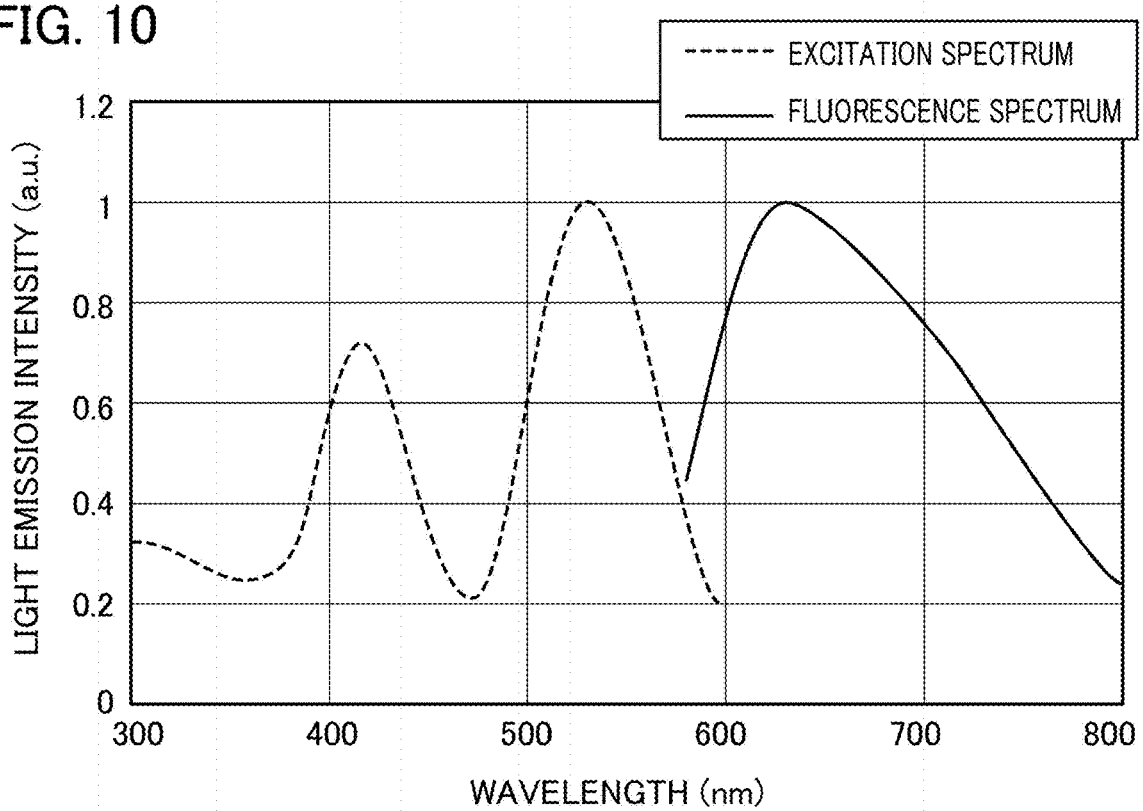
FIG. 10 is a graph illustrating an excitation spectrum and light emission spectrum of a phosphor used in a light emitting device of Example 2.

Next, similarly to Example 1, excitation characteristics and fluorescence characteristics of the phosphor of Example 2 were evaluated by using a spectrophotofluorometer. FIG. 10 illustrates an excitation spectrum and fluorescence spectrum of the phosphor of Example 2. Note that an excitation wavelength at the time of measuring the fluorescence spectrum was set to 540 nm, and a monitor wavelength at the time of measuring the excitation spectrum was set to a fluorescence peak wavelength. Moreover, in FIG. 10, both of the fluorescence spectrum and the excitation spectrum are standardized and shown while taking peak values thereof as 1.

The fluorescence spectrum of the phosphor of Example 2 was a broad spectrum that can be regarded to result from the $5d^1 \rightarrow 4f^1$ transition of $Ce^{3+}$. Then, the fluorescence spectrum of the phosphor of Example 2 formed a band spectrum across the whole of the wavelength range of 600 nm or more and 800 nm or less.

Note that peak wavelengths of the fluorescence spectrum and excitation spectrum of the phosphor of Example 2 were 630 nm and 531 nm, respectively. This represents that the phosphor of Example 2 can efficiently absorb green to yellow light with a wavelength of around 510 to 560 nm and can perform wavelength conversion for the absorbed green to yellow light into fluorescence that forms a band spectrum across the whole of the wavelength range of 600 nm or more and 800 nm or less.

Figure 11:
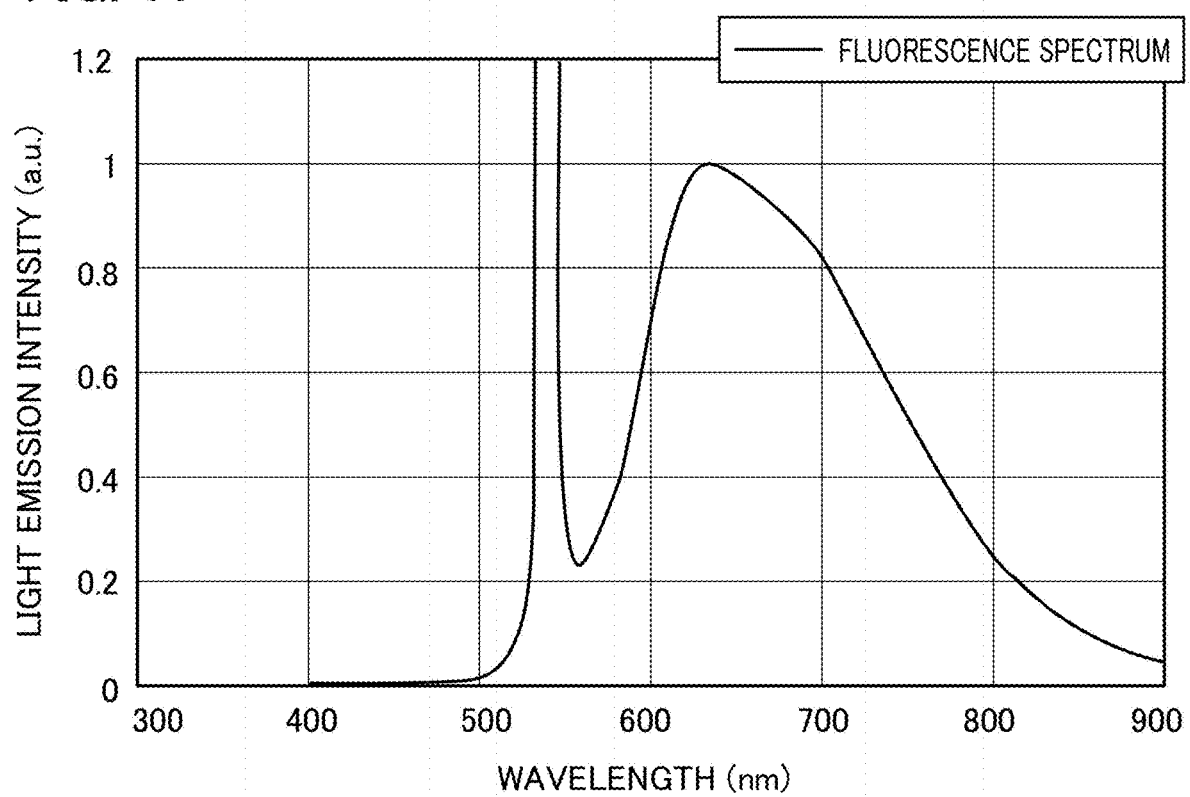
FIG. 11 is a graph illustrating a light emission spectrum of a phosphor used in a light emitting device of Example 3.

Next, similarly to Example 1, fluorescence characteristics of the phosphor of Example 3 were evaluated by using a spectrophotofluorometer. FIG. 11 illustrates a fluorescence spectrum of the phosphor of Example 3. Note that an excitation wavelength at the time of measuring the fluorescence spectrum was set to 540 nm. Moreover, in FIG. 11, the fluorescence spectrum is standardized and shown while taking a peak value thereof as 1. Note that a sharp spectrum at around 540 nm in FIG. 11 is a light component of monochromatic light used as excitation light, the light component having been reflected by the phosphor.

The fluorescence spectrum of the phosphor of Example 3 was a broad fluorescence spectrum that can be regarded to result from the $5d^1 \rightarrow 4f_1$ transition of $Ce^{3+}$. Then, the fluorescence spectrum of the phosphor of Example 3 formed a band spectrum across the whole of the wavelength range of 600 nm or more and 800 nm or less. Moreover, a peak wavelength in the fluorescence spectrum of the phosphor of Example 3 was 634 nm.

The above represents that the phosphor of Example 3 can absorb light with a single wavelength of around 540 nm and can perform wavelength conversion for the absorbed light into fluorescence that forms a band spectrum across the whole of the wavelength range of 600 nm or more and 800 nm or less.

Figure 12:
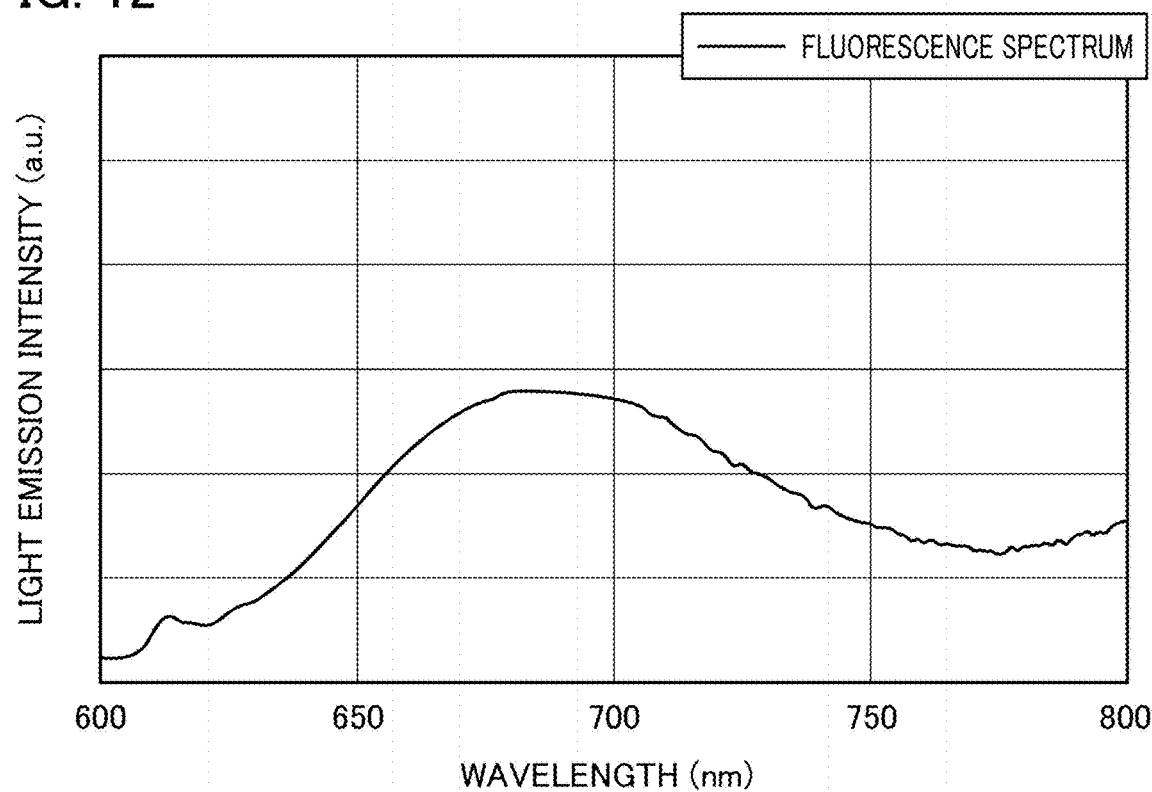
FIG. 12 is a graph illustrating a light emission spectrum of a phosphor used in a light emitting device of Example 4.

Next, fluorescence characteristics of the phosphor of Example 4 were evaluated by using a spectrophotofluorometer. FIG. 12 illustrates a fluorescence spectrum of the phosphor of Example 4. Note that an excitation wavelength at the time of measuring the fluorescence spectrum was set to 460 nm.

The fluorescence spectrum of the phosphor of Example 4 was a broad spectrum that can be regarded to result from the $4f^65d^1 \to 4f^7$ transition of $Eu^{2+}$. Then, the fluorescence spectrum of the phosphor of Example 4 was a spectrum that can be regarded to form a band spectrum across the whole of the wavelength range of 700 nm or more and 800 nm or less. Note that, for those skilled in the art, it is obvious that, though a component of a long wavelength in the fluorescence spectrum of the phosphor of Example 4 contains some noise, a light component is present across the whole of the wavelength range of 700 nm or more and 800 nm or less.

The above represents that the phosphor of Example 4 can absorb blue light with a wavelength of around 460 nm and can perform wavelength conversion for the absorbed blue light into fluorescence that forms a band spectrum across the whole of the wavelength range of 700 nm or more and 800 nm or less. Note that a full width at half maximum in the fluorescence spectrum of the phosphor of Example 4 was approximately 100 nm.

Figure 13:
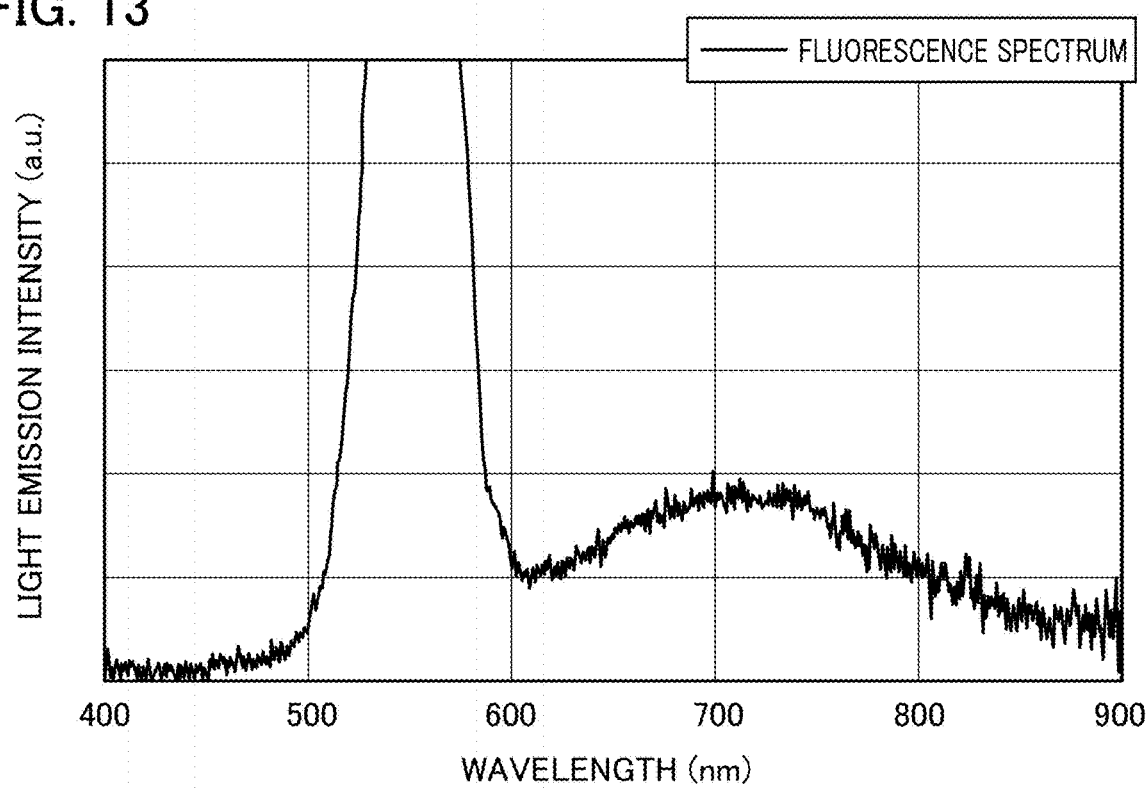
FIG. 13 is a graph illustrating a light emission spectrum of a phosphor used in a light emitting device of Example 5.

Next, fluorescence characteristics of the phosphor of Example 5 were evaluated by using a spectrophotofluorometer. FIG. 13 illustrates a fluorescence spectrum of the phosphor of Example 5. Note that an excitation wavelength at the time of measuring the fluorescence spectrum was set to 540 nm. Herein, a sharp spectrum at around 540 nm in FIG. 13 is a light component of monochromatic light used as excitation light, the light component having been reflected by the phosphor.

The fluorescence spectrum of the phosphor of Example 5 was a broad spectrum that can be regarded to result from the $5d^1 \to 4f^1$ transition of $Ce^{3+}$. Then, the fluorescence spectrum of the phosphor of Example 5 was a spectrum that can be regarded to form a band spectrum across at least the whole of the wavelength range of 700 nm or more and 800 nm or less. Moreover, the fluorescence spectrum of the phosphor of Example 5 was also a spectrum that can be regarded to form a band spectrum across the whole of the wavelength range of 600 nm or more and 800 nm or less.

The above represents that the phosphor of Example 5 can absorb green light with a wavelength of around 540 nm and can perform wavelength conversion for the absorbed green light into fluorescence that forms a band spectrum across the whole of the wavelength range of 700 nm or more and 800 nm or less. Moreover, the above represents that the phosphor of Example 5 can absorb green light with a wavelength of around 540 nm and can perform wavelength conversion for the absorbed green light into fluorescence that forms a band spectrum across the whole of the wavelength range of 600 nm or more and 800 nm or less. Note that a full width at half maximum in the fluorescence spectrum of the phosphor of Example 5 was approximately 160 nm.

Figure 14:
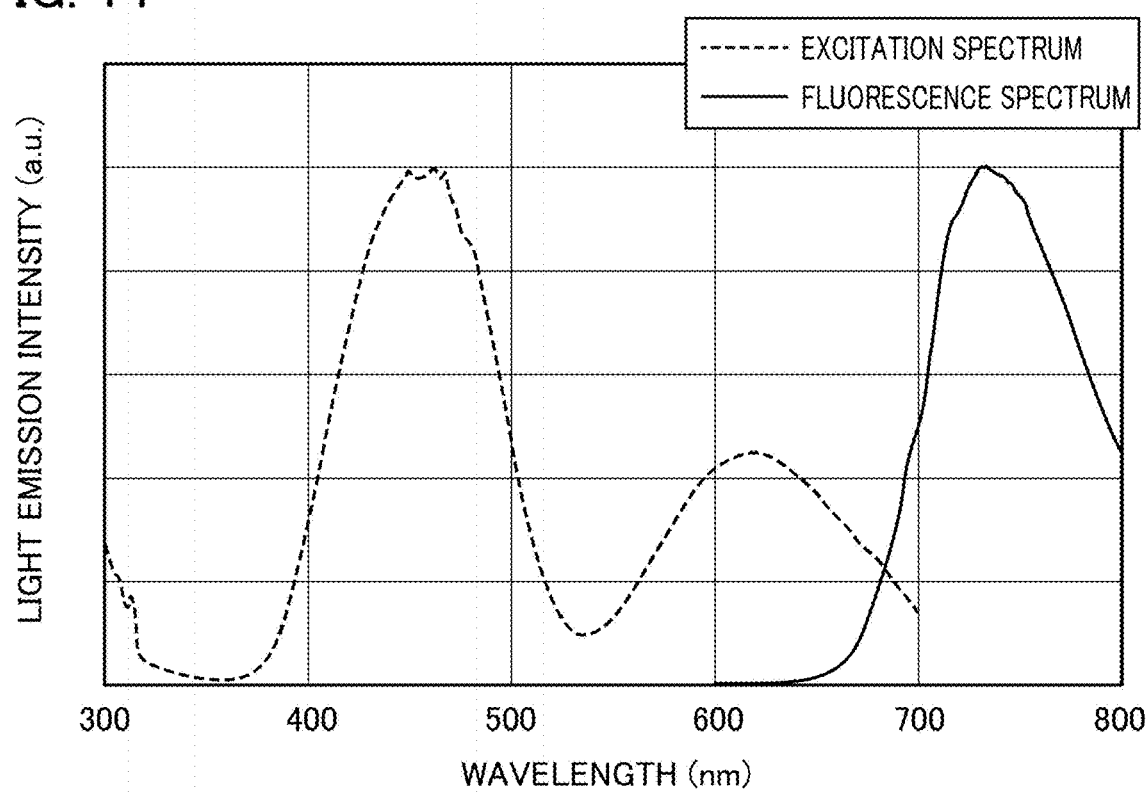
FIG. 14 is a graph illustrating an excitation spectrum and light emission spectrum of a phosphor used in a light emitting device of Example 6.

Next, excitation characteristics and fluorescence characteristics of the phosphor of Example 6 were evaluated by using a spectrophotofluorometer. FIG. 14 illustrates an excitation spectrum and fluorescence spectrum of the phosphor of Example 6. Note that an excitation wavelength at the time of measuring the fluorescence spectrum was set to 450 nm, and a monitor wavelength at the time of measuring the excitation spectrum was set to a fluorescence peak wavelength. Moreover, in FIG. 14, light emission intensities of the fluorescence spectrum and the excitation spectrum are standardized and shown so as to be equal to each other.

The fluorescence spectrum of the phosphor of Example 6 was a broad spectrum that can be regarded to result from the d-d transition of $Cr^{3+}$. Then, the fluorescence spectrum of the phosphor of Example 6 was a spectrum that can be regarded to form a band spectrum across the whole of the wavelength range of 700 nm or more and 800 nm or less. Note that a peak wavelength of the fluorescence spectrum in the phosphor of Example 6 was 735 nm.

Moreover, as seen from FIG. 14, the phosphor of Example 6 had intense excitation bands in a wavelength region of 400 nm or more and 500 nm or less and a wavelength region of 580 nm or more and 680 nm or less. That is, the phosphor of Example 6 was a phosphor that intensely absorbs purple to blue-green light and orange to dark red light and emits fluorescence.

The above represents that the phosphor of Example 6 is excited by a solid-state light-emitting element that emits at least one type of light selected from purple, blue, blue-green, orange, red, and dark red. Then, the above represents that the phosphor of Example 6 can perform wavelength conversion for the excitation light into fluorescence that forms a band spectrum across the whole of the wavelength range of 700 nm or more and 800 nm or less. Note that a full width at half maximum in the fluorescence spectrum of the phosphor of Example 6 was approximately 100 nm.

Next, a wavelength converter including the phosphor of Example 7 was fabricated, and fluorescence characteristics thereof were evaluated. Specifically, first, the phosphor of Example 7 was formed into a pellet shape by using a hand press, whereby a wavelength converter was fabricated. Subsequently, the obtained wavelength converter was excited by laser light, and energy (radiant flux of fluorescence) of fluorescence radiated from the wavelength converter at that time was measured. At this time, a central wavelength of the laser light was set to 445 nm. Moreover, energy of the laser light was changed from 0.93 W to 3.87 W. A power meter was used for evaluating the energy of the laser light. Moreover, an integrating sphere was used for evaluating the energy of the fluorescence emitted from the wavelength converter.

TABLE 1

| Energy of laser light (W) | Energy density of laser light (W/mm$^2$) | Energy of wavelength-converted light (mW) |
|---|---|---|
| 0.93 | 0.73 | 199 |
| 1.67 | 1.31 | 346 |
| 2.4 | 1.89 | 484 |
| 3.14 | 2.46 | 610 |
| 3.87 | 3.04 | 700 |

In Table 1, energy of the fluorescence radiated from the wavelength converter when the energy of the laser light is changed from 0.93 W to 3.87 W is shown. For reference, an energy density of the laser light is also shown in Table 1.

As shown in Table 1, light with energy of 100 mW or more was emitted from the wavelength converter. Then, even when the energy of the laser light was increased from 0.93 W to 3.87 W, the wavelength converter radiated light with high energy. That is, it has been found out that the $Cr^{3+}$-activated phosphor can maintain high light emission efficiency even in a region where the energy of the excitation light is high. This result is largely different from the conventional technical common sense that it is essential to use a phosphor with a short afterglow (less than 10 μs) in order to suppress saturation of the fluorescence output, and is surprising. Moreover, when consideration is taken for the case where the phosphor generates heat to raise a temperature of the phosphor when the phosphor is excited by the laser light with high energy, it can also be said that the phosphor of Example 7 is an excellent phosphor in which such a temperature rise gives less reduction to light emission efficiency.

Figure 15:
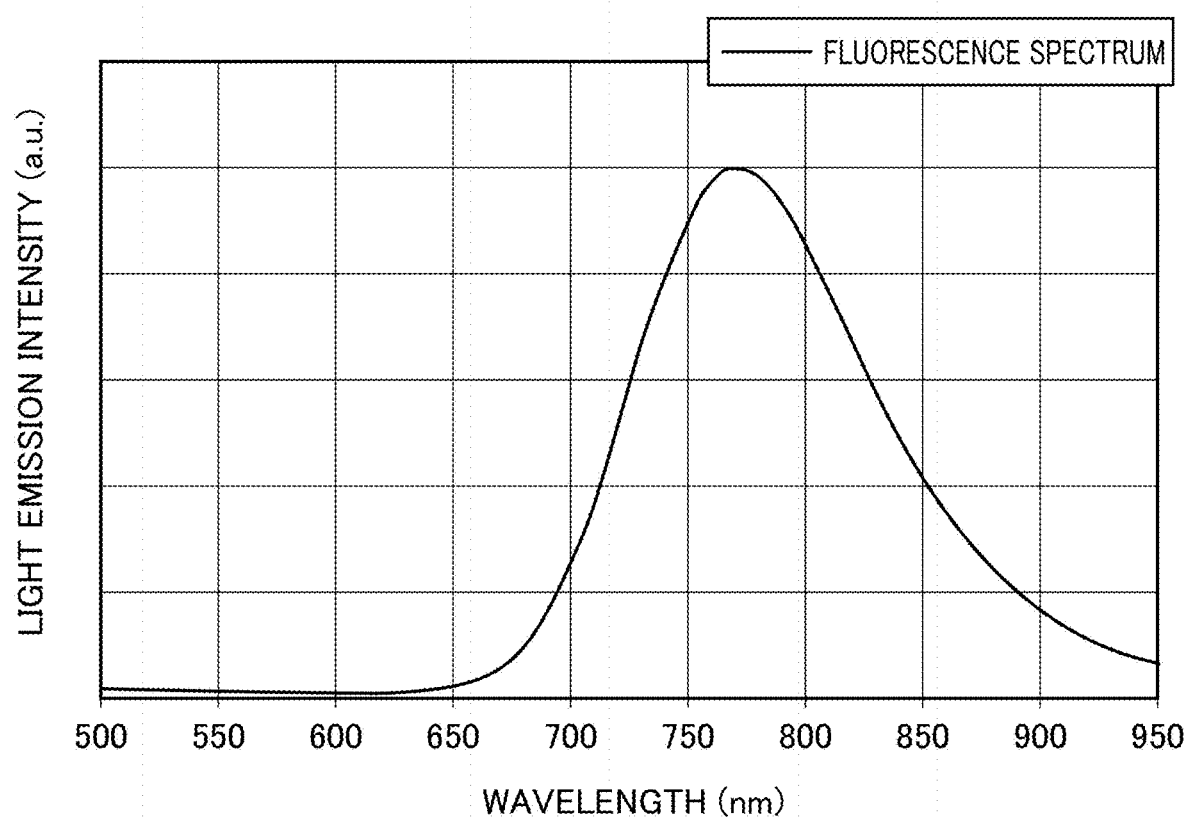
FIG. 15 is a graph illustrating a light emission spectrum of a phosphor used in a light emitting device of Example 7.

FIG. 15 is a fluorescence spectrum when the wavelength converter including the phosphor of Example 7 was excited by the laser light with energy of 3.87 W. The fluorescence spectrum of the wavelength converter including the phosphor of Example 7 was a broad spectrum that can be regarded to result from the d-d transition of $Cr^{3+}$. Then, this fluorescence spectrum was a spectrum that can be regarded to form a band spectrum across the whole of the wavelength range of 700 nm or more and 800 nm or less. Note that a peak wavelength of the fluorescence spectrum when the wavelength converter including the phosphor of Example 7 was excited by the laser light with energy of 3.87 W was 767 nm. Moreover, a full width at half maximum of a peak of this fluorescence spectrum was approximately 100 nm.

Although the contents of this embodiment have been described above in accordance with the examples, it is obvious to those skilled in the art that this embodiment is not limited to the description of these and that various modifications and improvements are possible.

The entire contents of Japanese Patent Application No. 2019-017797 (filed on: Feb. 4, 2019) are incorporated herein by reference.

INDUSTRIAL APPLICABILITY

In accordance with the present disclosure, there can be provided a light emitting device capable of radiating near-infrared light that efficiently excites a photosensitive substance, and there can be provided a medical device using the light emitting device.

REFERENCE SIGNS LIST 1, 1A, 1B, 1C Light emitting device
2 Solid-state light-emitting element
3, 3A Wavelength converter
4 First phosphor
6 Primary light
7 First wavelength-converted light
8 Second phosphor
9 Second wavelength-converted light

The invention claimed is:

1. A light emitting device, comprising:
a solid-state light-emitting element that emits primary light in which an energy density is 0.5 W/mm² or more; and
a wavelength converter including a single phosphor, wherein the single phosphor emits first wavelength-converted light,
wherein the single phosphor consists of a crystal structure of garnet,
wherein the first wavelength-converted light has a light component across at least a whole of a wavelength range of 700 nm or more and less than 800 nm,
wherein the first wavelength-converted light has a fluorescence peak within a wavelength range of 700 nm to 1000 nm,
wherein energy of fluorescence emitted from the wavelength converter is 100 mW or more, and
wherein the light emitting device is used for a photodynamic therapy.

2. The light emitting device according to claim 1, wherein the first wavelength-converted light has the light component across a whole of a wavelength range of 600 nm or more and 800 nm or less.

3. The light emitting device according to claim 1, wherein the single phosphor includes at least one of a $Eu^{2+}$-activated phosphor or a $Ce^{3+}$-activated phosphor.

4. The light emitting device according to claim 1, wherein the single phosphor includes a $Cr^{3+}$-activated phosphor.

5. The light emitting device according to claim 1, wherein the solid-state light-emitting element radiates the primary light having a maximum intensity value within a wavelength range of 430 nm or more and 480 nm or less, 500 nm or more and 560 nm or less, or 600 nm or more and 700 nm or less.

6. A medical device comprising the light emitting device according to claim 1.

7. The light emitting device according to claim 1, wherein, in the first wavelength-converted light, a 1/e fluorescence lifetime is 20 ns or more and 1000 μs or less.

* * * * *